(12) United States Patent
Yamakoshi et al.

(10) Patent No.: US 10,513,775 B2
(45) Date of Patent: Dec. 24, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Risa Yamakoshi, Toyama (JP); Masato Terasaki, Toyama (JP); Takashi Ozaki, Toyama (JP); Naonori Akae, Toyama (JP); Hideki Horita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/642,791

(22) Filed: Jul. 6, 2017

(65) Prior Publication Data

US 2017/0298508 A1    Oct. 19, 2017

Related U.S. Application Data

(63) Continuation of application No. PCT/JP2015/050250, filed on Jan. 7, 2015.

(51) Int. Cl.
*C23C 16/455* (2006.01)
*C23C 16/30* (2006.01)
(Continued)

(52) U.S. Cl.
CPC ........ *C23C 16/45527* (2013.01); *C23C 16/30* (2013.01); *C23C 16/308* (2013.01);
(Continued)

(58) Field of Classification Search
None
See application file for complete search history.

(56) References Cited

U.S. PATENT DOCUMENTS

2003/0024477 A1    2/2003 Okuda et al.
2013/0252439 A1    9/2013 Hirose et al.
(Continued)

FOREIGN PATENT DOCUMENTS

JP    2003-045864 A    2/2003
JP    2012169438 A    9/2012
(Continued)

OTHER PUBLICATIONS

International Search Report, PCT/JP2015/050250, dated Mar. 10, 2015, 2 pgs.
(Continued)

*Primary Examiner* — Alexander G Ghyka
(74) *Attorney, Agent, or Firm* — Volpe and Koenig, P.C.

(57) ABSTRACT

A method of manufacturing a semiconductor device, includes: forming an oxynitride film on a substrate by performing a cycle a predetermined number of times, the cycle including non-simultaneously performing supplying a precursor gas to the substrate through a first nozzle, supplying a nitriding gas to the substrate through a second nozzle, and supplying an oxidizing gas to the substrate through a third nozzle, wherein in the act of supplying the nitriding gas, an inert gas is supplied from at least one of the first nozzle and the third nozzle at a first flow rate, and in the act of supplying the oxidizing gas, an inert gas is supplied from the second nozzle at a second flow rate larger than the first flow rate.

14 Claims, 13 Drawing Sheets

(51) Int. Cl.
*H01L 21/67* (2006.01)
*H01L 21/02* (2006.01)
*C23C 16/44* (2006.01)
*H01L 21/677* (2006.01)

(52) U.S. Cl.
CPC .... *C23C 16/4401* (2013.01); *C23C 16/45531* (2013.01); *C23C 16/45574* (2013.01); *H01L 21/0214* (2013.01); *H01L 21/0228* (2013.01); *H01L 21/02211* (2013.01); *H01L 21/67017* (2013.01); *H01L 21/67109* (2013.01); *H01L 21/67248* (2013.01); *H01L 21/67757* (2013.01)

(56) References Cited

U.S. PATENT DOCUMENTS

| | | |
|---|---|---|
| 2013/0273748 A1 | 10/2013 | Sasajima et al. |
| 2014/0051260 A1 | 2/2014 | Sasajima et al. |
| 2014/0080314 A1 | 3/2014 | Sasajima et al. |
| 2014/0220787 A1 | 8/2014 | Sasajima et al. |
| 2014/0220788 A1* | 8/2014 | Sano ................ H01L 21/67109 438/775 |

FOREIGN PATENT DOCUMENTS

| | | |
|---|---|---|
| JP | 2013-225660 A | 10/2013 |
| JP | 2014-038923 A | 2/2014 |
| JP | 2014-060302 A | 4/2014 |
| WO | 2012/060379 A1 | 5/2012 |

OTHER PUBLICATIONS

Office Action in JP counterpart Application No. 2016-568206 dated Oct. 18, 2017.

\* cited by examiner

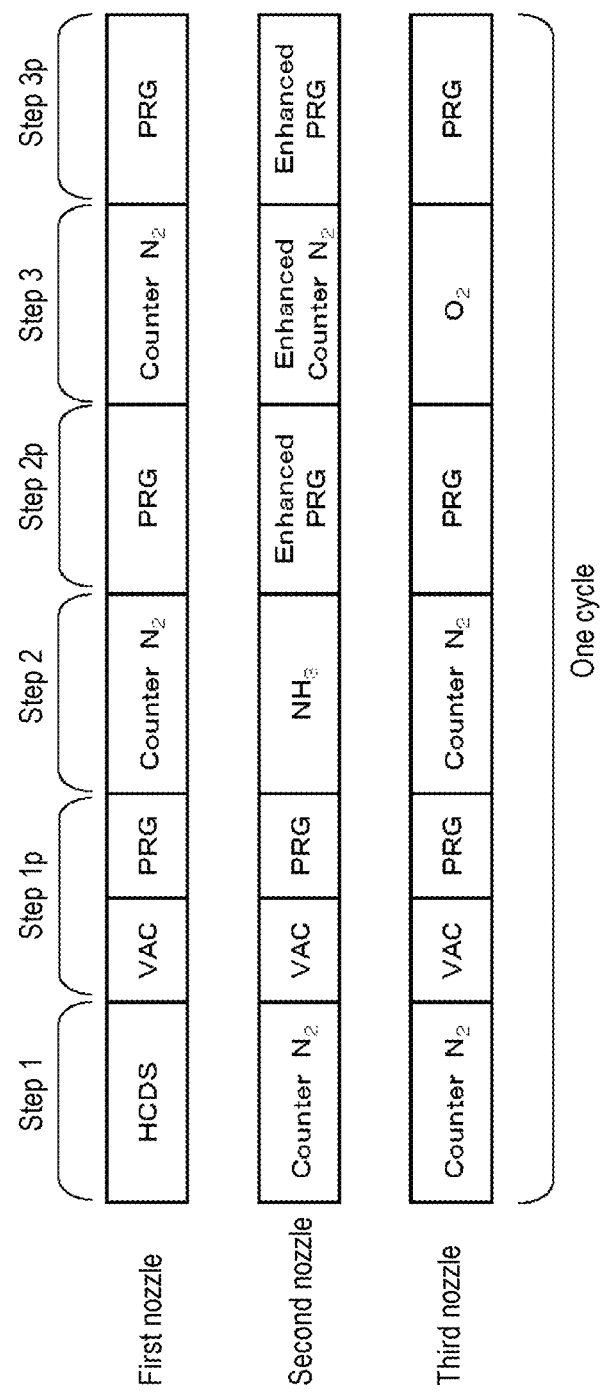

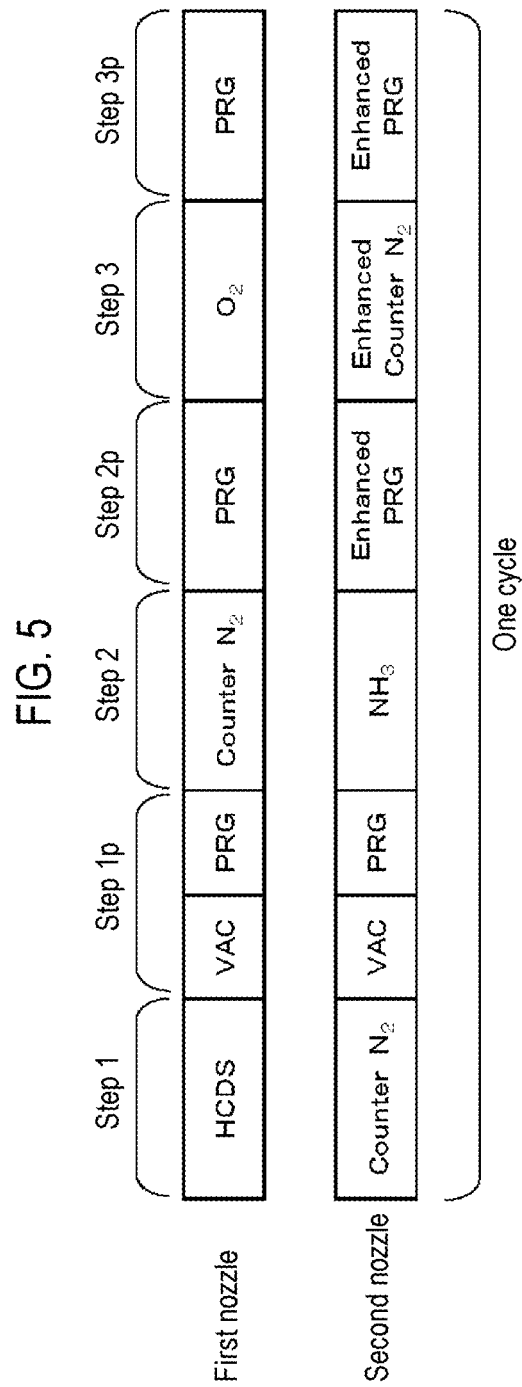

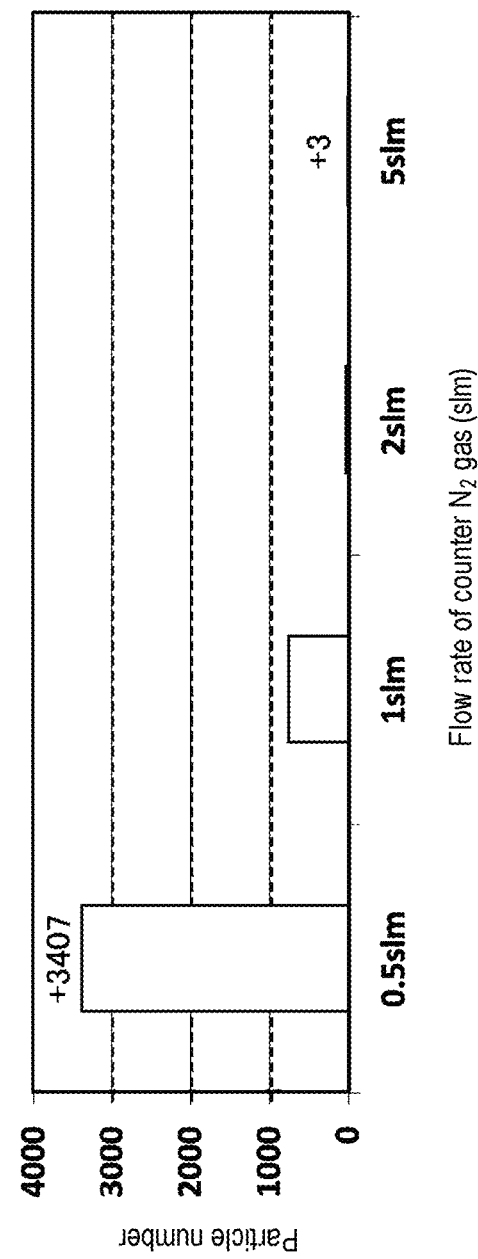

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Continuation Application of PCT International Application No. PCT/JP2015/050250, filed Jan. 7, 2015, the disclosure of which is incorporated herein in its entirety by reference.

TECHNICAL FIELD

The present disclosure relates to a method of manufacturing a semiconductor device, a substrate processing apparatus, and a recording medium

BACKGROUND

As one processes for manufacturing a semiconductor device, a film forming process for forming an oxynitride film on a substrate is performed by supplying a precursor gas, an oxidizing gas and a nitriding gas to the substrate in a process chamber.

However, the inventors have clarified through intensive research the fact that, when carrying out the film forming process described above, there may be a case where particles are generated in a large amount in the process chamber. The present disclosure provides some embodiments of a technique capable of suppressing generation of particles when an oxynitride film is formed on a substrate.

SUMMARY

According to one embodiment of the present disclosure, there is provided a method of manufacturing a semiconductor device, including:

forming an oxynitride film on a substrate by performing a cycle a predetermined number of times, the cycle including non-simultaneously performing supplying a precursor gas to the substrate through a first nozzle, supplying a nitriding gas to the substrate through a second nozzle, and supplying an oxidizing gas to the substrate through a third nozzle, wherein in the act of supplying the nitriding gas, an inert gas is supplied from at least one of the first nozzle and the third nozzle at a first flow rate, and in the act of supplying the oxidizing gas, an inert gas is supplied from the second nozzle at a second flow rate larger than the first flow rate.

According to the present disclosure, it is possible to suppress generation of particles when an oxynitride film is formed on a substrate.

BRIEF DESCRIPTION OF DRAWINGS

FIG. 4 is a diagram showing the gas supply timing for each nozzle in one cycle of a film forming sequence according to one embodiment of the present disclosure.

FIG. 5 is a diagram showing the gas supply timing for each nozzle in one cycle of a film forming sequence according to another embodiment of the present disclosure.

FIG. 7A is a view showing the measurement result of the number of particles on a wafer surface.

DETAILED DESCRIPTION

One Embodiment of the Present Disclosure

One embodiment of the present disclosure will now be described in detail with reference to FIGS. 1 to 3.

(1) Configuration of Substrate Processing Apparatus

Figure 1:
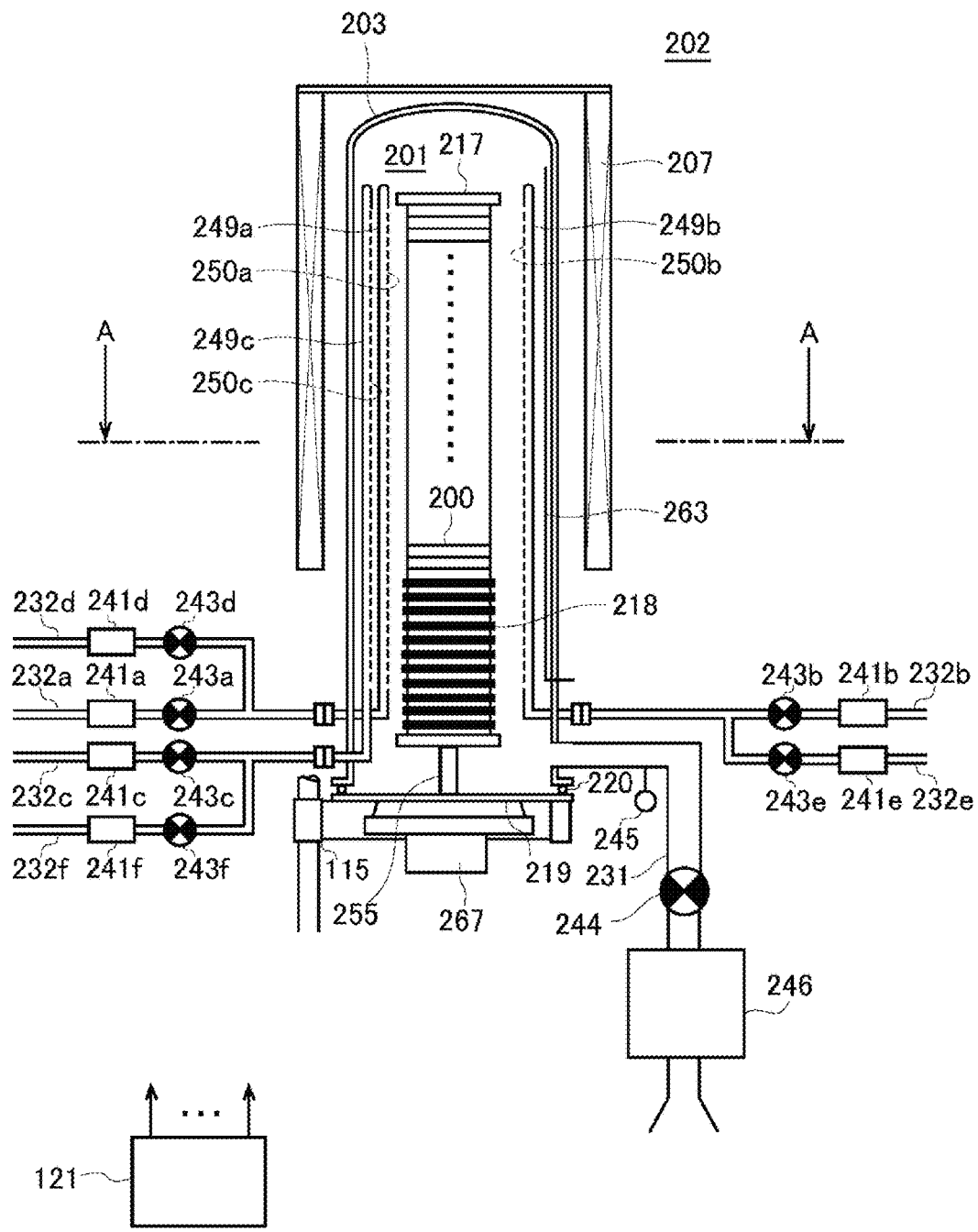
FIG. 1 is a schematic configuration view of a vertical processing furnace of a substrate processing apparatus suitably used in an embodiment of the present disclosure, in which a portion of the processing furnace is shown in a vertical cross section.
Figure 2:
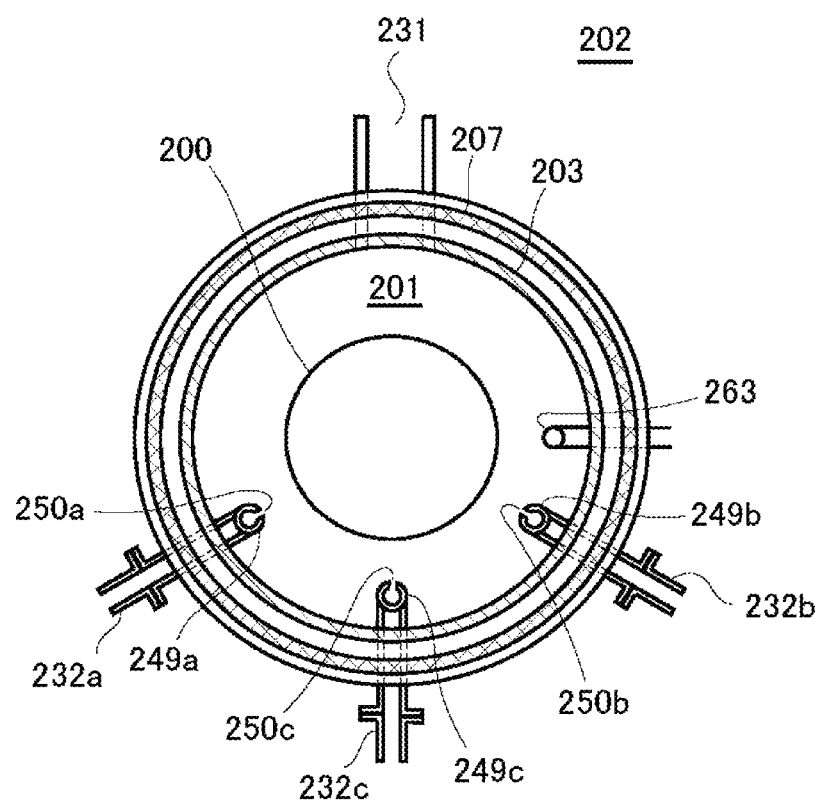
FIG. 2 is a schematic configuration view of a part of the vertical processing furnace of the substrate processing apparatus suitably used in the embodiment of the present disclosure, in which a portion of the processing furnace is shown in a cross section taken along line A-A in FIG. 1.

As illustrated in FIG. 1, a processing furnace 202 includes a heater 207 as a heating means (heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 constituting a reaction vessel (process vessel) is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates in a state in which the wafers 200 are aligned in a horizontal posture and in multiple stages along a vertical direction in a boat 217 which will be described later.

In the process chamber 201, a nozzle (first nozzle) 249a, a nozzle (second nozzle) 249b and a nozzle (third nozzle) 249c are provided so as to penetrate a lower side wall of the reaction tube 203. The nozzles 249a to 249c are made of a heat resistant material such as quartz or SiC. Gas supply pipes 232a to 232c are connected to the nozzles 249a to 249c, respectively. As described above, three nozzles 249a to 249c and three gas supply pipes 232a to 232c are provided in the reaction tube 203 so that plural kinds of gases can be supplied into the process chamber 201.

However, the processing furnace 202 of the present embodiment is not limited to the above-described form. For example, a metallic manifold supporting the reaction tube 203 may be provided below the reaction tube 203. The respective nozzles may be provided so as to penetrate the side wall of the manifold. In this case, an exhaust pipe 231 to be described later may be further provided in the manifold. Even in this case, the exhaust pipe 231 may not be provided in the manifold but may be provided in the lower portion of the reaction tube 203. In this manner, the furnace opening portion of the processing furnace 202 may be made of metal, and the nozzles or the like may be attached to the metal-made furnace opening portion.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides, respectively. Gas supply pipes 232d to 232f, which supply an inert gas, are respectively connected to the gas supply pipes 232a to 232c at the downstream side of the valves 243a to 243c. MFCs 241d to 241f, which are flow rate controllers (flow rate control parts), and valves 243d to 243f, which are opening/closing valves, are installed in the gas supply pipes 232d to 232f sequentially from the corresponding upstream sides, respectively.

The nozzles 249a to 249c are connected to front end portions of the gas supply pipes 232a to 232c. As illustrated in FIG. 2, the nozzles 249a to 249c are respectively provided in an annular space between the inner wall of the reaction tube 203 and the wafers 200 such that the nozzles 249a to 249c extend upward along a stacking direction of the wafers 200 from a lower portion of the inner wall of the reaction tube 203 to an upper portion thereof. Specifically, the nozzles 249a to 249c are respectively installed at a lateral side of a wafer arrangement region in which the wafers 200 are arranged, namely in a region which horizontally surrounds the wafer arrangement region, so as to extend along the wafer arrangement region. That is to say, the nozzles 249a to 249c are respectively installed in a perpendicular relationship with the surfaces (flat surfaces) of the wafers 200 at a lateral side of the end portions (peripheral edge portions) of the wafers 200 which are loaded into the process chamber 201. The nozzles 249a to 249c are respectively configured as L-shaped long nozzles. The horizontal portions of the nozzles 249a to 249c are installed to penetrate the side wall of the reaction tube 203. The vertical portions of the nozzles 249a to 249c are installed to extend upward at least from one end portion of the wafer arrangement region toward the other end portion thereof. Gas supply holes 250a to 250c for supplying gases are respectively formed on the side surfaces of the nozzles 249a to 249c. The gas supply holes 250a to 250c are opened toward the center of the reaction tube 203 and are capable of supplying gases toward the wafers 200. The gas supply holes 250a to 250c may be formed in a plural number between the lower portion of the reaction tube 203 and the upper portion thereof. The respective gas supply holes 250a to 250c may have the same aperture area and may be formed at the same aperture pitch.

As described above, in the present embodiment, gases are transferred through the nozzles 249a to 249c, which are disposed in a vertically-elongated annular space, i.e., a cylindrical space, defined by the inner wall of the reaction tube 203 and the end portions of the wafers 200 stacked one above another. The gases are initially injected into the reaction tube 203, near the wafers 200, through the gas supply holes 250a to 250c formed in the nozzles 249a to 249c. Accordingly, the gases supplied into the reaction tube 203 mainly flow in the reaction tube 203 in a direction parallel to the surfaces of the wafers 200, i.e., in a horizontal direction. With this configuration, the gases can be uniformly supplied to the respective wafers 200. This makes it possible to improve the film thickness of a thin film formed on each of the wafers 200. The gases flowing on the surfaces of the wafers 200, i.e., the reacted residual gases, flow toward an exhaust port, i.e., the exhaust pipe 231 which will be described later. The flow direction of the residual gas is not limited to the vertical direction but may be appropriately decided depending on the position of the exhaust port.

A precursor gas having a predetermined element, for example, a halosilane precursor gas containing Si as a predetermined element and a halogen element, is supplied from the gas supply pipe 232a into the process chamber 201 through the MFC 241a, the valve 243a and the nozzle 249a.

The halosilane precursor gas refers to a gaseous halosilane precursor, for example, a gas obtained by vaporizing a halosilane precursor which remains in a liquid state under room temperature and atmospheric pressure, or a halosilane precursor which remains in a gas state under room temperature and atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be said to be one kind of halide. When the term "precursor" is used herein, it may refer to "a liquid precursor staying in a liquid state," "a precursor gas staying in a gaseous state," or both.

As the halosilane precursor gas, it may be possible to use, e.g., a precursor gas containing Si and Cl, namely a chlorosilane precursor gas. As the chlorosilane precursor gas, it may be possible to use, e.g., a hexachlorodisilane ($Si_2Cl_6$, abbreviation: HCDS) gas. In the case of using a liquid precursor such as HCDS or the like which stays in a liquid state under room temperature and atmospheric pressure, the liquid precursor is vaporized by a vaporization system such as a vaporizer, a bubbler or the like and is supplied as a precursor gas (HCDS gas).

For example, an oxygen (O)-containing gas as a reaction gas having a chemical structure (molecular structure) different from that of the precursor gas is supplied from the gas supply pipe 232b into the process chamber 201 through the MFC 241b, the valve 243b and the nozzle 249b. The O-containing gas acts as an oxidizing gas, i.e., an O source in a film forming process to be described later. As the O-containing gas, for example, an oxygen ($O_2$) gas may be used.

For example, a carbon (C)-containing gas as a reaction gas having a chemical structure different from that of the precursor gas is supplied from the gas supply pipe 232b into the process chamber 201 through the MFC 241b, the valve 243b and the nozzle 249b. As the C-containing gas, for example, a hydrocarbon-based gas may be used. The hydrocarbon-based gas may also be regarded as a substance composed of only two elements C and H and may act as a C source in a film forming process to be described later. As the hydrocarbon-based gas, for example, a propylene ($C_3H_6$) gas may be used.

Moreover, as a reaction gas having a chemical structure different from that of the precursor gas, for example, a gas containing nitrogen (N) and carbon (C) is supplied from the gas supply pipe 232b into the process chamber 201 through the MFC 241b, the valve 243b and the nozzle 249b. As the gas containing N and C, for example, an amine-based gas may be used.

The amine-based gas refers to amine in a gaseous state, for example, a gas obtained by vaporizing amine which remains in a liquid state under room temperature and atmospheric pressure, or a gas containing an amine group such as amine which remains in a gaseous state under room temperature and atmospheric pressure. The amine-based gas includes amines such as ethylamine, methylamine, propylamine, isopropylamine, butylamine, isobutylamine and the like. Amine is a generic term for compounds obtained by replacing H in ammonia ($NH_3$) with a hydrocarbon group such as an alkyl group or the like. Amine contains a hydrocarbon group such as an alkyl group or the like as a C-containing ligand, i.e., an organic ligand. The amine-based gas contains three elements C, N and H. Since the amine-based gas does not contain Si, the amine-based gas may be referred to as a Si-free gas. Since the amine-based gas does not contain Si and metal, the amine-based gas may be referred to as a Si- and metal-free gas. The amine-based gas may be said to be a substance composed of only three elements C, N and H. The amine-based gas also acts as an N source and also as a C source in a film forming process to be described later. As used herein, the term "amine" means "amine in a liquid state", an "amine-based gas in a gaseous state", or both.

As the amine-based gas, it may be possible to use, for example, a triethylamine (($C_2H_5$)$_3$N, abbreviation: TEA) gas in which the number of C-containing ligands (ethyl groups) in the chemical structural formula (in one molecule) thereof is plural and in which the number of C is larger than the number of N in one molecule. In the case of using amine which remains in a liquid state under room temperature and atmospheric pressure like TEA, amine in a liquid state is vaporized by a vaporization system such as a vaporizer or a bubbler and is supplied as an amine-based gas (TEA gas).

Furthermore, as a reaction gas having a chemical structure different from that of the precursor gas, for example, a boron (B)-containing gas containing no borazine ring skeleton is supplied from the gas supply pipe 232b into the process chamber 201 through the MFC 241b, the valve 243b and the nozzle 249b. As the boron-containing gas containing no borazine ring skeleton, for example, a borane-based gas may be used.

The borane-based gas is a borane compound in a gaseous state, for example, a gas obtained by vaporizing a borane compound which remains in a liquid state under room temperature and atmospheric pressure, or a borane compound which remains in a gaseous state under room temperature and atmospheric pressure. The borane compound includes a haloborane compound containing B and a halogen element, for example, a chloroborane compound containing B and Cl. Furthermore, the borane compound includes borane (boron hydride) such as monoborane ($BH_3$) or diborane ($B_2H_6$), and a borane compound (borane derivative) obtained by replacing H of borane with other element or the like. The borane-based gas acts as a B source in a film forming process to be described later. As the borane-based gas, for example, trichloroborane ($BCl_3$) gas may be used. The $BCl_3$ gas is a B-containing gas not containing a borazine compound to be described later, i.e., a non-borazine-based B-containing gas.

Furthermore, as a reaction gas having a chemical structure different from that of the precursor gas, for example, a gas containing a borazine ring skeleton is supplied from the gas supply pipe 232b into the process chamber 201 through the MFC 241b, the valve 243b and the nozzle 249b. As the gas containing a borazine ring skeleton, for example, a gas containing a borazine ring skeleton and an organic ligand, i.e., an organic borazine-based gas may be used.

As the organic borazine-based gas, for example, a gas containing an alkyl borazine compound which is an organic borazine compound may be used. The organic borazine-based gas may also be referred to as a borazine compound gas or a borazine-based gas. In this regard, borazine is a heterocyclic compound composed of three elements B, N and H, and the composition formula thereof may be represented by $B_3H_6N_3$. The borazine compound is a compound containing a borazine ring skeleton (also referred to as a borazine skeleton) which constitutes a borazine ring composed of three B atoms and three N atoms. The organic borazine compound is a borazine compound containing C and may be said to be a borazine compound which contains a C-containing ligand, i.e., an organic ligand. The alkyl borazine compound is a borazine compound containing an alkyl group and may be said to be a borazine compound containing an alkyl group as an organic ligand. The alkyl borazine compound is obtained by substituting at least one of six H atoms contained in borazine with a hydrocarbon containing one or more C atoms. The alkyl borazine compound has a borazine ring skeleton constituting a borazine ring and may be said to be a substance containing B, N, H and C. Moreover, the alkyl borazine compound may be said to be a substance having a borazine ring skeleton and containing an alkyl ligand. The borazine-based gas also acts as a B source, an N source and a C source in a film forming process to be described later.

As the borazine-based gas, it may be possible to use, for example, an n, n', n"-trimethylborazine (abbreviation: TMB) gas, an n, n', n"-triethylborazine (abbreviation: TEB) gas, an n, n', n"-tri-n-propylborazine (abbreviation: TPB) gas, an n, n', n"-triisopropylborazine (abbreviation: TIPB) gas, an n, n', n"-tri-n-butylborazine (abbreviation: TBB) gas, an n, n', n"-triisobutylborazine (abbreviation: TIBB) gas, and the like. In the case of using a borazine compound such as TMB or the like which remains in a liquid state under room temperature and atmospheric pressure, the borazine compound in a liquid state is vaporized by a vaporization system such as a vaporizer or a bubbler and is supplied as a borazine-based gas (TMB gas or the like).

As a reaction gas having a chemical structure (molecular structure) different from that of the precursor gas, for example, a nitrogen (N)-containing gas is supplied from the gas supply pipe 232c into the process chamber 201 through the WC 241c, the valve 243c and the nozzle 249c. As the N-containing gas, for example, a hydrogen-nitride-based gas may be used. The hydrogen-nitride-based gas may also be referred to as a substance composed of only two elements N and H and may act as a nitriding gas, i.e., an N source in a film forming process to be described later. As the hydrogen-nitride-based gas, for example, an ammonia ($NH_3$) gas may be used.

As an inert gas, for example, a nitrogen ($N_2$) gas is supplied from the gas supply pipes 232d to 232f into the process chamber 201 through the MFCs 241d to 241f, the valves 243d to 243f, the gas supply pipes 232a to 232c, and the nozzles 249a to 249c.

In the case of supplying the precursor gas from the gas supply pipe 232a, a precursor gas supply system is mainly configured by the gas supply pipe 232a, the WC 241a, and the valve 243a. The nozzle 249a may be included in the precursor gas supply system. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying the O-containing gas from the gas supply pipe 232b, an O-containing gas supply system is mainly configured by the gas supply pipe 232b, the WC 241b, and the valve 243b. The nozzle 249b may be included in the O-containing gas supply system. The O-containing gas supply system may also be referred to as an oxidizing gas supply system or an oxidant supply system.

In the case of supplying the C-containing gas from the gas supply system 232b, a C-containing gas supply system is mainly configured by the gas supply pipe 232b, the WC 241b and the valve 243b. The nozzle 249b may be included in the C-containing gas supply system. In the case of supplying a hydrocarbon gas from the gas supply pipe 232b, the C-containing gas supply system may also be referred to as a hydrocarbon gas supply system or a hydrocarbon supply system.

In the case of supplying the gas containing N and C from the gas supply pipe 232b, an N- and C-containing gas supply system is mainly configured by the gas supply pipe 232b, the WC 241b and the valve 243b. The nozzle 249b may be included in the N- and C-containing gas supply system. In the case of supplying an amine-based gas from the gas supply pipe 232b, the N- and C-containing gas supply system may also be referred to as an amine-based gas supply system or an amine supply system. Since the gas containing N and C is an N-containing gas and a C-containing gas, the N- and C-containing gas supply system may be included in an N-containing gas supply system and a C-containing gas supply system to be described later.

In the case of supplying the B-containing gas from the gas supply pipe 232b, a B-containing gas supply system is mainly configured by the gas supply pipe 232b, the WC 241b and the valve 243b. The nozzle 249b may be included in the B-containing gas supply system. In the case of supplying a borane-based gas from the gas supply pipe 232b, the B-containing gas supply system may also be referred to as a borane-based gas supply system or a borane compound supply system. In the case of supplying a borazine-based gas from the gas supply pipe 232b, the B-containing gas supply system may also be referred to as a borazine-based gas supply system, an organic borazine-based gas supply system, or a borazine compound supply system. Since the borazine-based gas is a gas containing N and C, an N-containing gas and a C-containing gas, the borazine-based gas supply system may be included in the N- and C-containing gas supply system, an N-containing gas supply system and a C-containing gas supply system to be described later.

In the case of supplying the N-containing gas from the gas supply pipe 232c, an N-containing gas supply system is mainly configured by the gas supply pipe 232c, the MFC 241c and the valve 243c. The nozzle 249c may be included in the N-containing gas supply system. The N-containing gas supply system may also be referred to as a nitriding gas supply system or a nitriding agent supply system. In the case of supplying a hydrogen-nitride-based gas from the gas supply pipe 232c, the N-containing gas supply system may also be referred to as a hydrogen-nitride-based gas supply system or a hydrogen nitride supply system.

Any one or all of the above-described O-containing gas supply system, C-containing gas supply system, N- and C-containing gas supply system, B-containing gas supply system and N-containing gas supply system may be referred to as a reaction gas supply system, or a reactant supply system.

Further, an inert gas supply system is mainly configured by the gas supply pipes 232d to 232f, the MFCs 241d to 241f and the valves 243d to 243f The inert gas supply system may also be referred to as a purge gas supply system, a dilution gas supply system, a carrier gas supply system, or a counter gas supply system.

An exhaust pipe 231 configured to exhaust the internal atmosphere of the process chamber 201 is installed in the reaction tube 203. A vacuum pump 246 as a vacuum exhaust device is connected to the exhaust pipe 231 through a pressure sensor 245 as a pressure detector (pressure detection part), which detects the internal pressure of the process chamber 201, and an auto pressure controller (APC) valve 244 as a pressure regulator (pressure regulation part). The APC valve 244 is a valve configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be included in the exhaust system.

A seal cap 219, which serves as a furnace opening cover capable of hermetically sealing a lower end opening of the reaction tube 203, is provided under the reaction tube 203. The seal cap 219 is configured to make contact with the lower end of the reaction tube 203 on a lower side in the vertical direction. The seal cap 219 is made of metal such as, e.g., stainless steel or the like, and is formed in a disc shape. An O-ring 220, which is a seal member making contact with the lower end portion of the reaction tube 203, is provided on an upper surface of the seal cap 219. A rotation mechanism 267 configured to rotate a boat 217, which will be described later, is installed on the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. That is to say, the boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described form. For example, instead of installing the heat insulating plates 218 below the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a to 249c, the temperature sensor 263 is formed in an L shape. The temperature sensor 263 is installed along the inner wall of the reaction tube 203.

Figure 3:
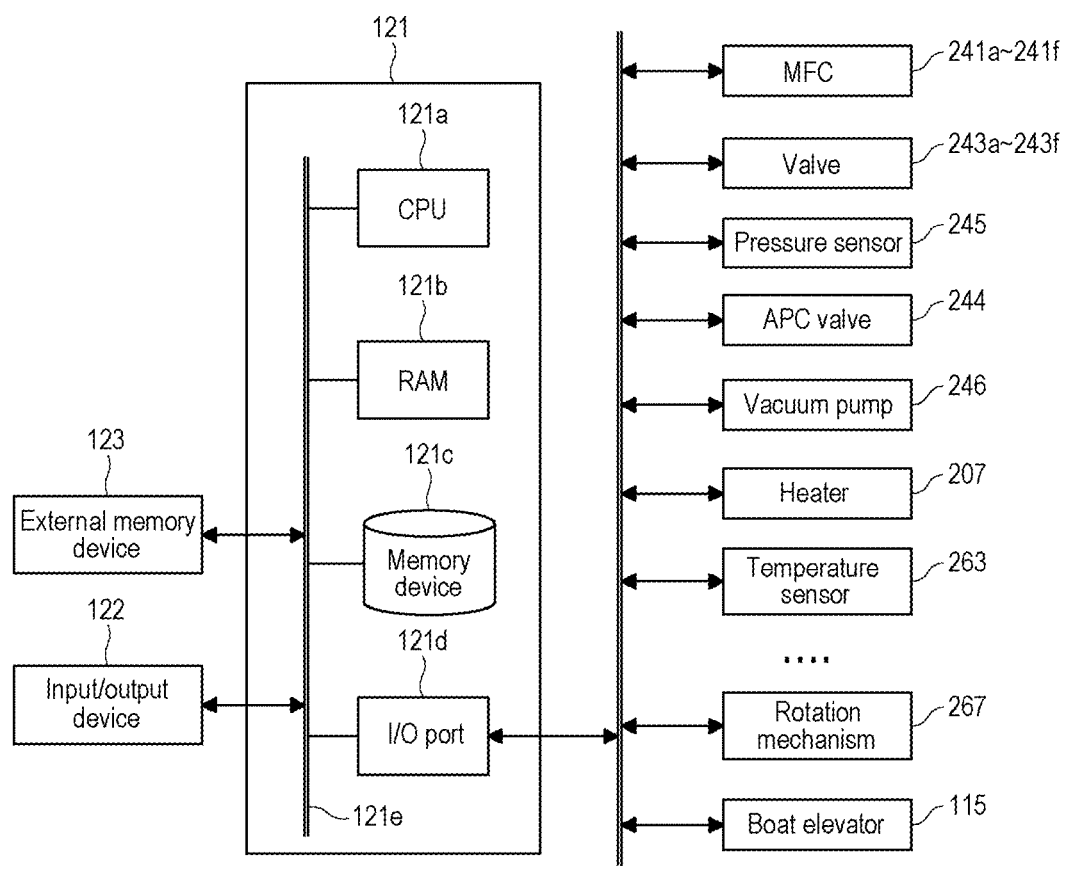
FIG. 3 is a schematic configuration diagram of a controller of the substrate processing apparatus suitably used in the embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a through an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, or a process recipe, in which sequences and conditions of a substrate processing process to be described later are written, are readably stored in the memory device 121c. The process recipe functions as a program for causing the controller 121 to execute each sequence in the substrate processing process, which will be described later, to obtain a predetermined result. Hereinafter, the process recipe and the control program will be generally and simply referred to as a "program". When the term "program" is used herein, it may indicate a case of including only the process recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the same. The CPU 121a is also configured to read the process recipe from the memory device 121c according to an input of an operation command from the input/output device 122. In addition, the CPU 121a is configured to control, according to the contents of the process recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 is not limited to a case where it is configured as a dedicated computer, but may be configured as a general-purpose computer. For example, by preparing an external memory device (for example, a magnetic tape, a magnetic disk such as a flexible disk or a hard disk, an optical disk such as a CD or a DVD, a magneto-optical disk such as an Mo or the like, or a semiconductor memory such as a USB memory or a memory card) 123 which stores the aforementioned program, and installing the program in a general-purpose computer using the external memory device 123, it is possible to form the controller 121 of the present embodiment. However, the means for supplying the program to the computer is not limited to the case where the program is supplied through the external memory device 123. For example, the program may be supplied through a communication means such as the Internet or a dedicated line without going through the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

(2) Substrate Processing Process

A sequence example of forming a film on a substrate using the aforementioned substrate processing apparatus, which is a process for manufacturing a semiconductor device, will be described below with reference to FIG. 4. In the following description, the operation of the respective parts that constitute the substrate processing apparatus are controlled by the controller 121.

In a film forming sequence illustrated in FIG. 4, a silicon oxynitride film (SiON film) is formed on a wafer 200 by performing, a predetermined number of times (one or more), a cycle which non-simultaneously or non-synchronously performs:

step 1 of supplying a HCDS gas to the wafer 200 through a nozzle 249a;

step 2 of supplying an $NH_3$ gas to the wafer 200 through a nozzle 249b; and step 3 of supplying an $O_2$ gas to the wafer 200 through a nozzle 249c.

In step 3 of supplying the $NH_3$ gas, an $N_2$ gas is supplied at a first flow rate from at least one of the nozzle 249a and the nozzle 249c (indicated by Counter $N_2$ in the drawing). In step 3 of supplying the $O_2$ gas, the $N_2$ gas is supplied at a second flow rate higher than the first flow rate from the nozzle 249b (indicated by Enhanced Counter $N_2$ in the drawing). FIG. 4 shows an example in which in step 2, the N₂ gas is supplied at the first flow rate from two of the nozzles 249a to 249c.

In the present disclosure, for the sake of convenience, the film forming sequence described above may be denoted as follows. The same denotation will be used in the modifications and other embodiments to be described later.

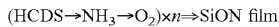

(HCDS→NH₃→O₂)×n⇒SiON film

When the term "wafer" is used herein, it may refer to "a wafer itself" or "a laminated body (assembly) of a wafer and a predetermined layer or film formed on the surface of the wafer." That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer." In that case, in the above description, "wafer" may be replaced with "substrate."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Process)

Thereafter, the next six steps, i.e., steps 1 and 1p, steps 2 and 2p, and steps 3 and 3p are sequentially executed. The specific processing conditions of the N₂ gas will be described in detail later without being described here.

[Step 1 (HCDS Gas Supply)]

In this step, a HCDS gas is supplied to the wafers 200 in the process chamber 201.

The valve 243a is opened, and a HCDS gas is caused to flow through the gas supply pipe 232a. The flow rate of the HCDS gas is adjusted by the MFC 241a. The HCDS gas is supplied into the process chamber 201 through the nozzle 249a and is exhausted from the exhaust pipe 231. At this time, the HCDS gas is supplied to the wafers 200 (indicated by HCDS in the drawing). At the same time, the valve 243d is opened, and an N₂ gas is caused to flow through the gas supply pipe 232d. The flow rate of the N₂ gas is adjusted by the MFC 241d. The N₂ gas is supplied together with the HCDS gas into the process chamber 201 and is exhausted from the exhaust pipe 231. The N₂ gas flowing through the gas supply pipe 232d acts as a carrier gas to promote the supply of the HCDS gas into the process chamber 201 and as a dilution gas for diluting the HCDS gas supplied into the process chamber 201.

Further, the valves 243e and 243f are opened, and an N₂ gas is caused to flow through the gas supply pipes 232e and 232f (indicated by Counter N₂ in the drawing). The N₂ gas is supplied into the process chamber 201 through the gas supply pipes 232b and 232c and the nozzles 249b and 249c and is exhausted from the exhaust pipe 231. The N₂ gas flowing through the gas supply pipes 232b and 232c acts as an entry suppressing gas, i.e., a counter gas, for suppressing entry of the HCDS gas into the nozzles 249b and 249c.

The supply flow rate of the HCDS gas controlled by the MFC 241a is, for example, a flow rate in a range of 1 to 2000 sccm, preferably 10 to 1000 sccm. The pressure inside the process chamber 201 is set to, for example, a pressure in a range of 1 to 2666 Pa, preferably 67 to 1333 Pa. The time period for supplying the HCDS gas to the wafers 200, i.e., the gas supply time period (irradiation time period) is set to, for example, a time period in a range of 1 to 120 seconds, preferably 1 to 60 seconds. The temperature of the heater 207 is set to a temperature such that the temperature of the wafers 200 is, for example, 250 to 700 degrees C., preferably 300 to 650 degrees C., more preferably 350 to 600 degrees C.

When the temperature of the wafers 200 is lower than 250 degrees C., it is difficult for the HCDS to be chemically adsorbed onto the wafers 200, whereby a practical deposition rate may not be obtained in some cases. By setting the temperature of the wafers 200 at 250 degrees C. or higher, it is possible to solve this problem. By setting the temperature of the wafers 200 at 300 degrees C. or higher, more preferably 350 degrees C. or higher, HCDS can be caused to be more sufficiently adsorbed onto the wafers 200, whereby a more sufficient deposition rate is obtained.

When the temperature of the wafers 200 exceeds 700 degrees C., the CVD reaction becomes too strong (an excessive gas phase reaction occurs). Thus, the film thickness uniformity tends to deteriorate, thereby making it difficult to control the film thickness uniformity. By setting the temperature of the wafers 200 at 700 degrees C. or lower, it is possible to generate an appropriate gas phase reaction. This makes it possible to suppress deterioration of the film thickness uniformity and to control the film thickness uniformity. In particular, by setting the temperature of the wafers 200 at 650 degrees C. or lower, more preferably 600 degrees C. or lower, a surface reaction becomes dominant over a gas phase reaction. This makes it easy to secure the film thickness uniformity and to control the film thickness uniformity.

Therefore, the temperature of the wafers 200 may be set to a temperature in a range of 250 to 700 degrees C., preferably 300 to 650 degrees C., more preferably 350 to 600 degrees C.

By supplying the HCDS gas to the wafers 200 under the aforementioned conditions, a first layer, for example, a Cl- and Si-containing layer having a thickness of from less than one atomic layer to several atomic layers is formed on the uppermost surface of the wafer 200. The Cl- and Si-containing layer may include a Cl-containing Si layer, an adsorption layer of HCDS, or both.

The Cl-containing Si layer is a generic term including not only a Cl-containing continuous layer formed of Si but also a discontinuous layer or a Cl-containing Si thin film formed by overlapping these layers. The Cl-containing continuous layer formed of Si may be referred to as a Cl-containing Si thin film. The Si constituting the Cl-containing Si layer includes not only Si whose bond with Cl is not completely broken but also Si whose bond with Cl is completely broken.

The adsorption layer of HCDS includes not only a continuous adsorption layer composed of HCDS molecules but also a discontinuous adsorption layer. That is to say, the adsorption layer of HCDS includes an adsorption layer having a thickness of one molecular layer or less than one molecular layer composed of HCDS molecules. HCDS molecules constituting the adsorption layer of HCDS include those in which the bond between Si and Cl is partially broken. That is to say, the adsorption layer of HCDS may include a physical adsorption layer of HCDS, a chemisorption layer of HCDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Cl- and Si-containing layer may include both a Cl-containing Si layer and an adsorption layer of HCDS. However, as described above, expressions such as "one atomic layer", "several atomic layers" and the like will be used with respect to the Cl- and Si-containing layer.

Under a condition in which the HCDS gas is autolyzed (pyrolized), i.e., under a condition in which the pyrolysis reaction of the HCDS gas occurs, Si is deposited on the wafer 200 to form a Cl-containing Si layer. Under a condition in which the HCDS gas is not autolyzed (pyrolized), i.e., under a condition in which the pyrolysis reaction of the HCDS gas does not occur, HCDS is adsorbed onto the wafer 200 to form an adsorption layer of HCDS. From the viewpoint of increasing the deposition rate, it may be more advantageous to form the Cl-containing Si layer on the wafer 200 than to form the adsorption layer of HCDS on the wafer 200. Hereinafter, for the sake of convenience, the Cl- and Si-containing layer will be simply referred to as a Si-containing layer.

If the thickness of the first layer exceeds several atomic layers, a modifying action in step 2, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to become one atomic layer or less, namely one atomic layer or less than one atomic layer, it is possible to relatively increase the action of a modifying reaction in step 2 which will be described later and to shorten the time required in a modifying reaction in step 2. It is also possible to shorten the time required in the formation of the first layer in step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

As the precursor gas, in addition to the HCDS gas, it may be possible to use, for example, an inorganic precursor gas such as a dichlorosilane ($SiH_2Cl_2$, abbreviation: DCS) gas, a monochlorosilane ($SiH_3Cl$, abbreviation: MCS) gas, a tetrachlorosilane i.e. silicon tetrachloride ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane ($SiH_4$, abbreviation: MS) gas or the like, and an organic precursor gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, a bis (tertiary) butylaminosilane ($SiH_2[NH(C_4H_9)]_2$, abbreviation: BTBAS) gas or the like.

[Step 1p (HCDS Gas Discharge)]

After the first layer is formed, the valves 243a and 243d to 243f are closed to stop the supply of the HCDS gas and the $N_2$ gas. At this time, the interior of the process chamber 201 is evacuated (vacuum evacuated or vacuum drawn) by the vacuum pump 246 while keeping the APC valve 244 open, so that the HCDS gas unreacted or contributed to the formation of the first layer, which remains in the process chamber 201, is removed from the interior of the process chamber 201. That is to say, the vacuum drawing of the interior of the process chamber 201 is performed in a state in which the supply of the $N_2$ gas into the process chamber 201 is stopped (indicated by VAC in the drawing). After a predetermined time has elapsed, the valves 243d to 243f are opened while keeping the APC valve 244 open and the supply of the $N_2$ gas into the process chamber 201 is started. That is to say, the interior of the process chamber 201 is evacuated as the $N_2$ gas is supplied into the process chamber 201 (indicated by PRG in the drawing). The $N_2$ gas acts as a purge gas for promoting removal of the HCDS gas remaining in the process chamber 201 from the interior of the process chamber 201 and acts as a counter gas for suppressing entry or back diffusion of the HCDS gas remaining in the process chamber 201 into the nozzles 249a to 249c.

In this step, the gas remaining within the process chamber 201 may not be completely removed and the interior of the process chamber 201 may not be completely purged. If the amount of the gas remaining within the process chamber 201 is small, an adverse effect may not be generated in step 2 which will be subsequently performed. The flow rate of the $N_2$ gas supplied into the process chamber 201 does not need to be large. For example, by supplying the $N_2$ gas in an amount substantially equal to the volume of the reaction tube 203 (the process chamber 201), it is possible to perform a purge operation without causing an adverse effect in step 2. As such, by not completely purging the interior of the process chamber 201, it is possible to shorten the purge time and to improve the throughput. It is also possible to suppress the consumption of the $N_2$ gas to a necessary minimum level.

[Step 2 (Supply of $NH_3$ Gas)]

After step 1p is completed, a thermally activated $NH_3$ gas is supplied to the wafers 200 in the process chamber 201.

In this step, the opening/closing control of the valves 243b and 243d to 243f is performed using the same procedure as the opening/closing control of the valves 243a and 243d to 243f in step 1, while keeping the valves 243a and 243c closed. The $NH_3$ gas is supplied into the process chamber 201 through the gas supply pipe 232b and the nozzle 249b, and is exhausted from the exhaust pipe 231. At this time, the $NH_3$ gas is supplied as a reaction gas to the wafers 200 (indicated by $NH_3$ in the drawing). The $N_2$ gas flowing through the gas supply pipe 232e acts as a carrier gas and a dilution gas as in step 1. The $N_2$ gas flowing through the gas supply pipes 232d and 232f acts as a counter gas for suppressing entry of the $NH_3$ gas into the nozzles 249a and 249c (indicated by Counter $N_2$ in the drawing) as in step 1.

The supply flow rate of the $NH_3$ gas controlled by the MFC 241b is set to, for example, a flow rate in a range of 100 to 10000 sccm. The pressure inside the process chamber 201 is set to, for example, a pressure in a range of 1 to 4000 Pa, preferably 1 to 3000 Pa. By setting the pressure inside the process chamber 201 to such a relatively high pressure, the $NH_3$ gas can be thermally activated in a non-plasma manner. By thermally activating and supplying the $NH_3$ gas, it is possible to generate a relatively soft reaction and to relatively softly perform a modifying process to be described later. The time period for supplying the thermally activated $NH_3$ gas to the wafers 200, i.e., the gas supply time period (irradiation time period), is set to, for example, a time period in a range of 1 to 120 seconds, preferably 1 to 60 seconds. Other processing conditions are the same as the processing conditions of step 1.

By supplying the $NH_3$ gas to the wafer 200 under the above-described conditions, it is possible to cause the first layer formed on the wafer 200 to react with the $NH_3$ gas, thereby modifying the first layer. Specifically, by supplying the $NH_3$ gas to the wafer 200, it is possible to impart an N component contained in the $NH_3$ gas to the first layer and to modify (nitride) at least a part of the first layer. As a result, a second layer containing Si and N, i.e., a SiN layer (N-containing Si layer) as a nitride layer is formed on the wafer 200. When forming the second layer, Cl contained in the first layer constitutes a gaseous substance containing at least Cl in the course of the modifying reaction with the $NH_3$ gas. The gaseous substance is discharged from the interior of the process chamber 201. That is to say, impurities such as Cl or the like in the first layer are separated from the first layer by being pulled out or desorbed from the first layer. As a result, the second layer becomes a layer having fewer impurities such as Cl or the like as compared with the first layer.

As the nitriding gas, in addition to the $NH_3$ gas, it may be possible to use, for example, a hydrogen-nitride-based gas such as a diazene ($N_2H_2$) gas, a hydrazine ($N_2H_4$) gas, an $N_3H_8$ gas or the like, a gas containing these compounds, and so forth.

[Step 2p ($NH_3$ Gas Discharge)]

After the second layer is formed, the valve 243b is closed to stop the supply of the $NH_3$ gas. At this time, while keeping the APC valve 244 open, the interior of the process chamber 201 is evacuated by the vacuum pump 246, whereby the $NH_3$ gas unreacted or contributed to the formation of the second layer, which remains in the process chamber 201, is removed from the interior of the process chamber 201. At this time, the valves 243d to 243f are kept open to maintain the supply of the $N_2$ gas into the process chamber 201 (indicated by PRG and Enhanced PRG in the drawing). That is to say, the interior of the process chamber 201 is evacuated in a state in which the supply of the $N_2$ gas into the process chamber 201 is performed. The $N_2$ gas acts as a purge gas for promoting removal of the $NH_3$ gas remaining in the process chamber 201 from the interior of the process chamber 201 and acts as a counter gas for suppressing entry or back diffusion of the $NH_3$ gas remaining in the process chamber 201 into the nozzles 249a to 249c. At this time, the gas and the like remaining in the process chamber 201 may not be completely removed as in step 1p.

[Step 3 ($O_2$ Gas Supply)]

After step 2p is completed, a thermally activated $O_2$ gas is supplied to the wafers 200 in the process chamber 201.

In this step, the opening/closing control of the valves 243c and 243d to 243f is performed using the same procedure as the opening/closing control of the valves 243a and 243d to 243f in step 1, while keeping the valves 243a and 243b closed. An $O_2$ gas is supplied into the process chamber 201 through the gas supply pipe 232c and the nozzle 249c, and is exhausted from the exhaust pipe 231. At this time, the $O_2$ gas is supplied as a reaction gas to the wafers 200 (indicated by $O_2$ in the drawing). The $N_2$ gas flowing through the gas supply pipe 232f acts as a carrier gas and a dilution gas as in step 1. Just like step 1, the $N_2$ gas flowing through the gas supply pipes 232d and 232e acts as a counter gas for suppressing entry of the $O_2$ gas into the nozzles 249a and 249b (indicated by Counter $N_2$ and Enhanced Counter $N_2$ in the drawing).

The supply flow rate of the $O_2$ gas controlled by the MFC 241c is set to, for example, a flow rate in a range of 100 to 10000 sccm. The pressure inside the process chamber 201 is set to, for example, a pressure in a range of 1 to 4000 Pa, preferably 1 to 3000 Pa. By setting the pressure inside the process chamber 201 to such a relatively high pressure, it is possible to thermally activate the $O_2$ gas in a non-plasma manner. By thermally activating and supplying the $O_2$ gas, it is possible to generate a relatively soft reaction and to relatively softly perform a modifying process to be described later. The time period for supplying the thermally activated $O_2$ gas to the wafers 200, i.e., the gas supply time period (irradiation time period), is set to, for example, a time period in a range of 1 to 120 seconds, preferably 1 to 60 seconds. Other processing conditions are the same as the processing conditions of step 1.

By supplying the $O_2$ gas to the wafer 200 under the above-described conditions, it is possible to cause the second layer formed on the wafer 200 to react with the $O_2$ gas, thereby modifying the second layer. Specifically, by supplying the $O_2$ gas to the wafer 200, it is possible to impart an O component contained in the $O_2$ gas to the second layer and to modify (oxidize) at least a part of the second layer. As a result, a third layer containing Si, O and N, i.e., a SiON layer (O- and N-containing Si layer) as an oxynitride layer is formed on the wafer 200. When forming the third layer, Cl contained in the second layer constitutes a gaseous substance containing at least Cl in the course of the modifying reaction with the $O_2$ gas. The gaseous substance is discharged from the interior of the process chamber 201. That is to say, impurities such as Cl or the like in the second layer are separated from the second layer by being pulled out or desorbed from the second layer. As a result, the third layer becomes a layer having fewer impurities such as Cl or the like as compared with the second layer.

As the oxidizing gas, in addition to the $O_2$ gas, it may be possible to use a O-containing gas such as water vapor ($H_2O$ gas), a nitrogen monoxide (NO) gas, a nitrous oxide ($N_2O$) gas, a nitrogen dioxide ($NO_2$) gas, a carbon monoxide (CO) gas, a carbon dioxide ($CO_2$) gas, an ozone ($O_3$) gas, a combination of an $H_2$ gas and an $O_2$ gas, a combination of an $H_2$ gas and an $O_3$ gas, or the like.

[Step 3p ($O_2$ Gas Discharge)]

After the third layer is formed, the valve 243c is closed to stop the supply of the $O_2$ gas. Then, by the same processing procedure as in step 2p, the $O_2$ gas unreacted or contributed to the formation of the third layer, which remains in the process chamber 201, is removed from the interior of the process chamber 201 (indicated by PRG and Enhanced PRG in the drawing). That is to say, the interior of the process chamber 201 is evacuated in a state in which the supply of the $N_2$ gas into the process chamber 201 is performed. The $N_2$ gas acts as a purge gas for promoting removal of the $O_2$ gas remaining in the process chamber 201 from the interior of the process chamber 201 and acts as a counter gas for suppressing entry or back diffusion of the $O_2$ gas remaining in the process chamber 201 into the nozzles 249a to 249c. At this time, the gas and the like remaining in the process chamber 201 may not be completely removed as in step 1p.

(Performing a Predetermined Number of Times)

A SiON film having a predetermined composition and a predetermined film thickness can be formed on the wafer 200 by performing, once or more (a predetermined number of times), the cycle which non-simultaneously performs the six steps described above. The cycle described above is preferably repeated a plurality of times. That is to say, it is preferable that the thickness of the SiON layer formed per cycle is made smaller than a desired film thickness, and the above-described cycle is repeated a plurality of times until the desired film thickness is obtained.

(Purging and Atmospheric Pressure Restoration)

The valves 243d to 243f are opened. The $N_2$ gas is supplied into the process chamber 201 from the respective gas supply pipes 232d to 232f and is exhausted from the exhaust pipe 231. The $N_2$ gas acts as a purge gas. Thus, the interior of the process chamber 201 is purged, and the gas or the reaction byproduct remaining in the process chamber 201 is removed from the interior of the process chamber 201 (purging). Thereafter, the atmosphere inside the process chamber 201 is substituted with an inert gas (inert gas substitution), and the pressure inside the process chamber 201 is restored to atmospheric pressure (atmospheric pressure restoration).

(Boat Unloading and Wafer Discharging)

The seal cap 219 is moved down by the boat elevator 115 and the lower end of the reaction tube 203 is opened. Then, the processed wafers 200 are unloaded from the lower end of the reaction tube 203 to the outside of the reaction tube 203 in a state in which the processed wafers 200 are supported on the boat 217 (boat unloading). The processed wafers 200 are discharged from the boat 217 (wafer discharging).

(3) Supply Conditions of $N_2$ Gas

In the film forming sequence described above, steps 1 to 3 are performed non-simultaneously. That is to say, after the residual gas and the like in the process chamber 201 are removed by performing steps 1p to 3p, the precursor gas (HCDS gas) and the reaction gas ($NH_3$ gas or the $O_2$ gas) are supplied into the process chamber 201. This makes it possible to avoid a gas phase reaction between the precursor gas and the reaction gas in the process chamber 201, for example, a gas phase reaction between the HCDS gas and the $NH_3$ gas or a gas phase reaction between the HCDS gas and the $O_2$ gas. As a result, it is possible to suppress generation of particles in the process chamber 201.

In the film forming sequence described above, in steps 2 and 3, the $NH_3$ gas and the $O_2$ gas are respectively supplied through the nozzles 249b and 249c different from the nozzle 249a for supplying the HCDS gas. Furthermore, in step 1, the $N_2$ gas is supplied as a counter gas into the nozzles 249b and 249c so as to prevent entry of the HCDS gas into the nozzles 249b and 249c. Moreover, in step 2, the $N_2$ gas is supplied as a counter gas into the nozzles 249a and 249c so as to prevent entry of the $NH_3$ gas into the nozzles 249a and 249c. In addition, in step 3, the $N_2$ gas is supplied as a counter gas into the nozzle 249c so as to prevent entry of the $O_2$ gas into the nozzles 249a and 249b. This makes it possible to avoid a gas phase reaction between the HCDS gas and the $O_2$ gas or a gas phase reaction between the HCDS gas and the $NH_3$ gas in the nozzles 249a to 249c. As a result, it is possible to suppress generation of particles in the nozzles 249a to 249c.

However, according to the intensive research conducted by the inventors, it has been found that the amount of particles generated in the process chamber 201 may increase depending on the supply conditions of the $N_2$ gas in the respective steps. For example, it has been found that when the flow rate of the $N_2$ gas supplied from the nozzle 249b in step 3 is set to be less than the flow rate of the $N_2$ gas supplied from the nozzles 249a and 249c in step 2, a large amount of particles may be generated in the nozzle 249b, whereby the amount of particles in the process chamber 201, particularly in the vicinity of the nozzle 249b, may increase.

According to the intensive research conducted by the inventors, it has been found that the aforementioned phenomenon is caused when the $O_2$ gas and the $NH_3$ gas are supplied in a mixed state to impurities contained in a small amount on the inner surface (the surface of the inner wall) of the nozzle 249b in the course of manufacturing the nozzle 249b, for example, impurities including a metal element such as iron (Fe), titanium (Ti), aluminum (Al) or the like. A generation mechanism of particles will be described in detail below.

If step 2p of discharging the $NH_3$ gas from the interior of the process chamber 201 is performed after performing step 2 of supplying the $NH_3$ gas into the process chamber 201 through the nozzle 249b, the $NH_3$ gas is discharged not only from the interior of the process chamber 201 but also from the interior of the nozzle 249b. However, depending on the processing conditions of step 2p, a small amount of $NH_3$ gas may adhere to and remain in the nozzle 249b. In addition, when step 3 of supplying the $O_2$ gas into the process chamber 201 through the nozzle 249c is performed after the step 2p, the $N_2$ gas is supplied as a counter gas from the nozzle 249b. However, even in this case, depending on the supply flow rate of the $N_2$ gas, a small amount of $O_2$ gas may enter the nozzle 249 b in some cases. Moreover, when step 3p of discharging the $O_2$ gas from the interior of the process chamber 201 is performed after step 3, the $N_2$ gas acting as a counter gas is supplied from the nozzle 249b. However, even in this case, depending on the supply flow rate of the $N_2$ gas, a small amount of $O_2$ gas may enter the nozzle 249b in some cases. The $O_2$ gas that has entered the nozzle 249b is mixed with the $NH_3$ gas remaining in the nozzle 249b. If the $O_2$ gas and the $NH_3$ gas are mixed in the nozzle 249b, these gases may react to generate an active radical containing OH groups and the like in some cases. This radical reacts with impurities including a metal element contained in the inner wall surface of the nozzle 249b, whereby a large amount of fine particles may be generated in some cases.

Therefore, in the film forming sequence according to the present embodiment, in order to suppress the generation of particles due to the above-described reaction occurring in the nozzle 249b, the supply conditions of the $N_2$ gas in the respective steps are set as follows, for example.

First, in step 2 of supplying the $NH_3$ gas, the $N_2$ gas is supplied from at least one of the nozzle 249a and the nozzle 249c at a first flow rate (Counter $N_2$). In step 3 of supplying the $O_2$ gas, the $N_2$ gas is supplied from the nozzle 249b at a second flow rate larger (higher) than the first flow rate (Enhanced Counter $N_2$). That is to say, assuming that the flow rate (first flow rate) of the $N_2$ gas supplied from the nozzles 249a and 249c in step 2 is $n_1$ (slm) and the flow rate (second flow rate) of the $N_2$ gas supplied from the nozzle 249b in step 3 is $n_2$ (slm), the MFCs 241d to 241f are controlled so that the relationship of $n_2 > n_1$ is established. By setting the flow rate of the $N_2$ gas acting as a counter gas as described above, it is possible to enhance the effect of preventing the $O_2$ gas from entering the nozzle 249b in step 3 and to reliably prevent the generation of particles inside the nozzle 249b. Even if $n_2 \geq n_1$, the above effect may be obtained in some cases. However, the relationship of $n_2 > n_1$ is preferred in that it is possible to reliably enhance the effect of preventing the entry of the $O_2$ gas into the nozzle 249b.

Furthermore, in step 1 of supplying the HCDS gas, the $N_2$ gas is supplied from at least one of the nozzle 249b and the nozzle 249c at a third flow rate (indicated by Counter $N_2$ in the drawing). In step 3 of supplying the $O_2$ gas, the $N_2$ gas is supplied from the nozzle 249b at a second flow rate larger (higher) than the aforementioned third flow rate (Enhanced Counter $N_2$). The aforementioned third flow rate is a flow rate smaller (lower) than the second flow rate described above. That is to say, assuming that the flow rate (third flow rate) of the $N_2$ gas supplied from the nozzles 249b and 249c in step 1 is $n_3$ (slm) and the flow rate (second flow rate) of the $N_2$ gas supplied from the nozzle 249b in step 3 is $n_2$ (slm), the MFCs 241d to 241f are controlled so that the relationship of $n_2 > n_3$ is established. By setting the flow rate of the $N_2$ gas acting as a counter gas as described above, it is possible to enhance the effect of preventing the $O_2$ gas from entering the nozzle 249b in step 3 and to reliably prevent the generation of particles inside the nozzle 249b. Even if $n_2 \geq n_3$, the above effect may be obtained in some cases. However, the relationship of $n_2 > n_3$ is preferred in that it is possible to reliably enhance the effect of preventing the entry of the $O_2$ gas into the nozzle 249b.

When $n_2 > n_1$ and $n_2 > n_3$, it is possible to satisfy $n_2 > n_1 \geq n_3$. That is to say, it is possible to satisfy $n_2 > n_1 = n_3$, or $n_2 > n_1 > n_3$.

In addition, when $n_2 \geq n_1$ and $n_2 > n_3$, it is possible to satisfy $n_2 \geq n_1 > n_3$. That is to say, if $n_1 > n_3$, it is possible not only to satisfy $n_2 > n_1$ but also to satisfy $n_2 = n_1$.

Further, during a period after step 3 of supplying the $O_2$ gas and before step 1 of supplying the HCDS gas again, the $N_2$ gas is supplied from the nozzle 249b at the aforementioned second flow rate (indicated by Enhanced PRG in the drawing). That is to say, the flow rate of the $N_2$ gas supplied from the nozzle 249b in step 3p of discharging the $O_2$ gas is made equal to the flow rate of the $N_2$ gas supplied from the nozzle 249b in step 3. The MFCs 241d to 241f are controlled so as to continuously supply the $N_2$ gas at the flow rate of $n_2$ (slm) from the nozzle 249b over step 3 to step 3p. The $N_2$ gas supplied from the nozzle 249b in step 3p acts as a counter gas as described above. By setting the flow rate of this gas as described above, it is possible to reliably prevent the entry of the $O_2$ gas into the nozzle 249b in step 3p, i.e., the generation of particles in the nozzle 249b.

Further, during a period after step 3 of supplying the $O_2$ gas and before step 1 of supplying the HCDS gas again, the vacuum drawing of the space where the wafers 200 exist in a state in which the supply of the gas is stopped is not performed. That is to say, in step 3p of discharging the $O_2$ gas, the vacuum drawing (VAC) performed in step 1p is not performed, and the opening/closing operation of the valve 243e is controlled so as to evacuate the interior of the process chamber 201 while the $N_2$ gas is continuously supplied, without stopping, at least from the nozzle 249b. When the aforementioned vacuum drawing is performed in step 3p, the flow of the $N_2$ gas flowing from the nozzle 249b to the exhaust port is stopped and the $O_2$ gas is likely to enter the nozzle 249b and the like by diffusion. On the other hand, by setting the processing procedure of step 3p as described above, it is possible to constantly form the flow of the $N_2$ gas flowing from the nozzle 249b to the exhaust port. This makes it possible to reliably prevent the entry of the $O_2$ gas into the nozzle 249b by diffusion, i.e., the generation of particles in the nozzle 249b.

Further, during a period after step 2 of supplying the $NH_3$ gas and before step 3 of supplying the $O_2$ gas, the $N_2$ gas is supplied from the nozzle 249b at the aforementioned second flow rate (indicated by Enhanced PRG in the drawing). In other words, the flow rate of the $N_2$ gas supplied from the nozzle 249b in step 2p of discharging the $NH_3$ gas is made equal to the flow rate of the $N_2$ gas supplied from the nozzle 249b in step 3. The MFCs 241d to 241f are controlled so as to continuously supply the $N_2$ gas at the flow rate of $n_2$ (slm) from the nozzle 249b over step 2p to step 3. As described above, the $N_2$ gas supplied from the nozzle 249b in step 2p acts as a purge gas and also as a counter gas. In the present embodiment, there is shown an example in which the MFCs 241d to 241f are controlled so that the $N_2$ gas is continuously supplied at the flow rate of $n_2$ (slm) (at the same flow rate) from the nozzle 249b over step 2p to step 3p. By setting the flow rate of this gas as described above, it is possible to reliably prevent the remaining of the $NH_3$ gas in the nozzle 249b or the back diffusion of the $NH_3$ gas into the nozzle 249b. As a result, in step 3 performed subsequently, it is possible to reliably prevent the generation of particles in the nozzle 249b.

Further, during a period after step 2 of supplying the $NH_3$ gas and before step 3 of supplying the $O_2$ gas, the vacuum drawing of the space where the wafers 200 exist in a state in which the supply of the gas is stopped is not performed. That is to say, in step 2p of discharging the $NH_3$ gas, the vacuum drawing (VAC) performed in step 1p is not performed, and the opening/closing operation of the valve 243e is controlled so as to evacuate the interior of the process chamber 201 while continuously performing the supply of the $N_2$ gas at least from the nozzle 249b without stopping. When the vacuum drawing is performed in step 2p, the flow of the $N_2$ gas purging the interior of the nozzle 249b or the flow of the $N_2$ gas flowing from the nozzle 249b to the exhaust port is stopped. Thus, the $NH_3$ gas is likely to remain in the nozzle 249b, or the $NH_3$ gas is likely to back-diffuse into the nozzle 249b or the like. On the other hand, by setting the processing procedure of step 2p as described above, it is possible to constantly form the flow of the $N_2$ gas flowing from the nozzle 249b to the exhaust port. This makes it possible to reliably prevent the remaining of the $NH_3$ gas in the nozzle 249b or the back diffusion of the $NH_3$ gas into the nozzle 249b. As a result, in step 3 performed subsequently, it is possible to reliably prevent the generation of particles in the nozzle 249b.

As described above, during a period after step 1 of supplying the HCDS gas and before step 2 of supplying the NH₃ gas, the vacuum drawing of the space where the wafers 200 exist in a state in which the supply of the gas is stopped is performed. That is to say, in step 1p of discharging the HCDS gas, the vacuum drawing (VAC) is performed for a predetermined time. By setting the processing procedure of step 1p as described above, it is possible to appropriately reduce the consumption amount of the N₂ gas in step 1p. This makes it possible to reduce the cost of the film forming process.

In steps 1 and 1p, steps 2 and 2p, and steps 3 and 3p, the supply flow rates of the N₂ gas controlled by the MFCs 241d to 241f may be respectively set to, for example, a flow rate in a range of 100 to 10000 sccm, while satisfying the above-described various conditions with arbitrary combinations. For example, $n_1$ may be 500 to 1500 sccm, $n_2$ may be 2000 to 10000 sccm, and $n_3$ may be 100 to 1000 sccm. As the inert gas used in the respective steps, in addition to the N₂ gas, it may be possible to use, for example, a rare gas such as an Ar gas, a He gas, a Ne gas, a Xe gas or the like.

(4) Effects According to the Present Embodiment

According to the present embodiment, one or more effects described below may be achieved.

(a) In step 2 of supplying the NH₃ gas, the N₂ gas is supplied from at least one of the nozzle 249a and the nozzle 249c at the first flow rate. In step 3 of supplying the O₂ gas, the N₂ gas is supplied from the nozzle 249b at the second flow rate larger than the aforementioned first flow rate. Thus, it is possible to reliably prevent the generation of particles in the nozzle 249b and to improve the quality of the film forming process.

Further, in step 1 of supplying the HCDS gas, the N₂ gas is supplied from at least one of the nozzle 249b and the nozzle 249c at the third flow rate. In step 3 of supplying the O₂ gas, the N₂ gas is supplied from the nozzle 249b at the second flow rate larger than the aforementioned third flow rate (at this time, the third flow rate becomes smaller than the aforementioned second flow rate). Thus, it is possible to reliably prevent the generation of particles in the nozzle 249b and to improve the quality of the film forming process.

(b) During a period after step 3 of supplying the O₂ gas and before step 1 of supplying the HCDS gas again, the N₂ gas is supplied from the nozzle 249b at the aforementioned second flow rate. This makes it possible to reliably prevent the generation of particles in the nozzle 249b and to improve the quality of the film forming process.

Further, during a period after step 3 of supplying the O₂ gas and before step 1 of supplying the HCDS gas again, the vacuum drawing of the space where the wafers 200 exist in a state in which the supply of the gas is stopped is not performed. This makes it possible to reliably prevent the generation of particles in the nozzle 249b and to improve the quality of the film forming process.

(c) During a period after step 2 of supplying the NH₃ gas and before step 3 of supplying the O₂ gas, the N₂ gas is supplied from the nozzle 249b at the aforementioned second flow rate. This makes it possible to reliably prevent the generation of particles in the nozzle 249b and to improve the quality of the film forming process.

Further, during a period after step 2 of supplying the NH₃ gas and before step 3 of supplying the O₂ gas, the vacuum drawing of the space where the wafers 200 exist in a state in which the supply of the gas is stopped is not performed. This makes it possible to reliably prevent the generation of particles in the nozzle 249b and to improve the quality of the film forming process.

(d) By selectively increasing the supply flow rate of the N₂ gas supplied from the nozzle 249b only in specific steps 3, 3p and 2p, it is possible to effectively obtain the aforementioned effects while suppressing the increase in the consumption amount of the N₂ gas, i.e., the film forming cost. On the other hand, if the supply flow rate of the N₂ gas supplied from the nozzle 249b is constantly increased in all steps 1, 1p, 2, 2p, 3 and 3p in order to effectively obtain the aforementioned effects, the consumption amount of the N₂ gas, i.e., the cost of the film forming process increases.

(e) By non-simultaneously performing steps 1 to 3, i.e., by non-simultaneously performing the supply of the HCDS gas, the NH₃ gas and the O₂ gas without synchronization, these gases can be caused to properly contribute to a reaction under a condition in which a gas phase reaction or a surface reaction appropriately occurs. As a result, it is possible to avoid an excess gas phase reaction in the process chamber, to reliably prevent the generation of particles, and to improve the quality of the film forming process. In addition, it is possible to improve the step coverage and the film thickness controllability of the SiON film formed on the wafer 200. Moreover, it is possible to improve the controllability of the composition ratio of the SiON film formed on the wafer 200 and to expand the control width of the composition ratio.

(f) In steps 2 and 3, the NH₃ gas and the O₂ gas are respectively supplied through the nozzles 249b and 249c different from the nozzle 249a which supplies the HCDS gas. This makes it possible to avoid a gas phase reaction between the HCDS gas and the O₂ gas or a gas phase reaction between the HCDS gas and the NH₃ gas in the nozzles 249b and 249c. As a result, it is possible to reliably prevent the generation of particles in the nozzles 249a to 249c and to improve the quality of the film forming process.

(g) During a period after step 1 of supplying the HCDS gas and before step 2 of supplying the NH₃ gas, the vacuum drawing of the space where the wafers 200 exist in a state in which the supply of the gas is stopped is performed. This makes it possible to reduce the consumption amount of the N₂ gas and to reduce the cost of the film forming process.

(h) The aforementioned effects may be similarly obtained by using a gas other than the HCDS gas as a precursor gas, using a gas other than the NH₃ gas as a nitriding gas, using a gas other than the O₂ gas as an oxidizing gas, and using a gas other than the N₂ gas as an inert gas.

(5) Modifications

The film forming sequence according to the present embodiment is not limited to the form shown in FIG. 4, but may be modified as in the modifications described below.

For example, a silicon oxycarbonitride film (SiOCN film) or a silicon borooxycarbonitride film (SiBOCN film) may be formed on the wafer 200 by the film forming sequence shown below. That is to say, the cycle including steps 1 to 3 may further include a step of supplying a gas containing at least one of C and B to the wafer 200. As a C source, for example, a $C_3H_6$ gas may be supplied, a TEA gas may be supplied instead of the $C_3H_6$ gas, or the $C_3H_6$ gas and the TEA gas may be supplied at the same time. As a B source, for example, a TMB gas may be supplied, or a $BCl_3$ gas may be supplied. As described above, the TMB gas also acts as a C source and as an N source. Even with these modifications, the same effects as those of the film forming sequence shown in FIG. 4 may be obtained. The film formed by the modification using the TMB gas as the B source contains B as one constituent element of a borazine ring skeleton constituting the film. Therefore, the modification using the TMB gas as the B source is preferred in that, as compared with the modification using the $BCl_3$ gas as the B source, it is possible to form a film having high oxidation resistance with less desorption of B from the film due to oxidation or the like.

(HCDS→$C_3H_6$→$NH_3$→$O_2$)×n⇒SiOCN film (HCDS→TEA→$NH_3$→$O_2$)×n⇒SiOCN film (HCDS→TMB→$NH_3$→$O_2$)×n⇒SiBOCN film (HCDS→$C_3H_6$→$BCl_3$→$NH_3$→$O_2$)×n⇒SiBOCN film Moreover, for example, as the precursor gas, in addition to the above-described various silane precursor gases, it may be possible to use organic silane precursor gases including an alkylhalosilane precursor gas such as a 1,1,2,2-tetrachloro-1,2-dimethyldisilane (($CH_3$)$_2$Si$_2$Cl$_4$, abbreviation: TCDMDS) gas or the like, an alkylene halosilane precursor gas such as a bis(trichlorosilyl)methane (($SiCl_3$)$_2$CH$_2$, abbreviation: BTCSM) gas or the like, an alkylene silane precursor gas such as 1,4-disilabutane ($Si_2C_2H_{10}$, abbreviation: DSB) or the like, and so forth. That is to say, as the precursor gas, it may be possible to use a silane precursor gas having a Si—C bond and acting as a C source. Film forming sequences in which the BTCSM gas and the TCDMDS gas are used as a precursor gas are shown below. Even with these modifications, the same effects as those of the film forming sequence shown in FIG. 4 may be obtained.

(BTCSM→$NH_3$→$O_2$)×n⇒SiOCN film (TCDMDS→$NH_3$→$O_2$)×n⇒SiOCN film

In the above-described modification, in the step of supplying the $C_3H_6$ gas to the wafer 200, the supply flow rate of the $C_3H_6$ gas controlled by the MFC 241b is set to, for example, a flow rate in a range of 100 to 10000 sccm. The pressure inside the process chamber 201 is set to, for example, a pressure in a range of 1 to 5000 Pa, preferably 1 to 4000 Pa. The partial pressure of the $C_3H_6$ gas in the process chamber 201 is set to, for example, a pressure in a range of 0.01 to 4950 Pa. The time period for supplying the $C_3H_6$ gas to the wafer 200, i.e., the gas supply time period (irradiation time period) is set to, for example, a time period in a range of 1 to 200 seconds, preferably 1 to 120 seconds, more preferably 1 to 60 seconds. Other processing conditions are, for example, the same processing conditions as those of step 2 of the film forming sequence shown in FIG. 4. As the C-containing gas, in addition to the $C_3H_6$ gas, it may be possible to use, for example, a hydrocarbon-based gas such as an acetylene ($C_2H_2$) gas, an ethylene ($C_2H_4$) gas or the like.

Further, in the step of supplying the TEA gas to the wafer 200, the supply flow rate of the TEA gas controlled by the MFC 241b is set to, for example, a flow rate in a range of 100 to 10000 sccm. The pressure inside the process chamber 201 is set to, for example, a pressure in a range of 1 to 5000 Pa, preferably 1 to 4000 Pa. The partial pressure of the TEA gas in the process chamber 201 is set to, for example, a pressure in a range of 0.01 to 4950 Pa. The time period for supplying the TEA gas to the wafer 200, i.e., the gas supply time period (irradiation time period) is set to, for example, a time period in a range of 1 to 200 seconds, preferably 1 to 120 seconds, more preferably 1 to 60 seconds. Other processing conditions are, for example, the same processing conditions as those of step 2 of the film forming sequence shown in FIG. 4. As the gas containing N and C, in addition to the TEA gas, it may be possible to use, for example, an ethylamine-based gas such as a diethylamine (($C_2H_5$)$_2$NH, abbreviation: DEA) gas, a monoethylamine ($C_2H_5NH_2$, abbreviation: MEA) gas or the like, and a methylamine-based gas such as a trimethylamine (($CH_3$)$_3$N, abbreviation: TMA) gas, a dimethylamine (($CH_3$)$_2$NH, abbreviation: DMA) gas, a monomethylamine ($CH_3NH_2$, abbreviation: MMA) gas or the like.

Further, in the step of supplying the $BCl_3$ gas to the wafer 200, the supply flow rate of the $BCl_3$ gas controlled by the MFC 241b is set to, for example, a flow rate in a range of 100 to 10000 sccm. The partial pressure of the $BCl_3$ gas in the process chamber 201 is set to, for example, a pressure in a range of 0.01 to 2640 Pa. Other processing conditions are, for example, the same processing conditions as those in step 1 of the film forming sequence shown in FIG. 4. As the B-containing gas, in addition to the $BCl_3$ gas, it may be possible to use, for example, a monochloroborane ($BClH_2$) gas, a dichloroborane ($BCl_2H$) gas, a trifluoroborane ($BF_3$) gas, a tribromoborane ($BBr_3$) gas, a diborane ($B_2H_6$) gas or the like.

In the step of supplying the TMB gas to the wafer 200, the supply flow rate of the TMB gas controlled by the MFC 241b is set to, for example, a flow rate in a range of 1 to 1000 sccm. The partial pressure of the TMB gas in the process chamber 201 is set to, for example, a pressure in a range of 0.0001 to 2424 Pa. Other processing conditions are, for example, the same processing conditions as those of step 1 of the film forming sequence shown in FIG. 4. As the B-containing gas containing a borazine ring skeleton, in addition to the TMB gas, it may be possible to use, for example, a TEB gas, a TPB gas, a TIPB gas, a TBB gas, a TIBB gas or the like.

The processing procedures and processing conditions in other steps may be the same as, for example, the processing procedures and processing conditions of the respective steps in the film forming sequence shown in FIG. 4.

Other Embodiments of the Present Disclosure

While one embodiment of the present disclosure has been specifically described above, the present disclosure is not limited to the aforementioned embodiment but may be diversely modified without departing from the spirit of the present disclosure.

For example, in the above-described embodiment, three nozzles 249a to 249c are provided in the process vessel, and the HCDS gas, the $NH_3$ gas and the $O_2$ gas are supplied through the respective nozzles. However, the present disclosure is not limited to such an embodiment. For example, as in a substrate processing apparatus shown in FIG. 8, two nozzles 249a and 249b may be provided in the process vessel, the gas supply pipes 232a and 232c may be connected to the nozzle 249a, and the gas supply pipe 232b may be connected to the nozzle 249b. That is to say, the HCDS gas and the $O_2$ gas may be supplied through the nozzle 249a, and the $NH_3$ gas may be supplied through the nozzle 249b.

In this case, as in the film forming sequence illustrated in FIG. 5, a SiON film may be formed on a wafer 200 by performing, a predetermined number of times (once or more), a cycle which non-simultaneously performs:

step 1 of supplying a HCDS gas to the wafer 200 through a nozzle 249a;

step 2 of supplying an $NH_3$ gas to the wafer 200 through a nozzle 249b; and step 3 of supplying an $O_2$ gas to the wafer 200 through a nozzle 249a.

Figure 8:
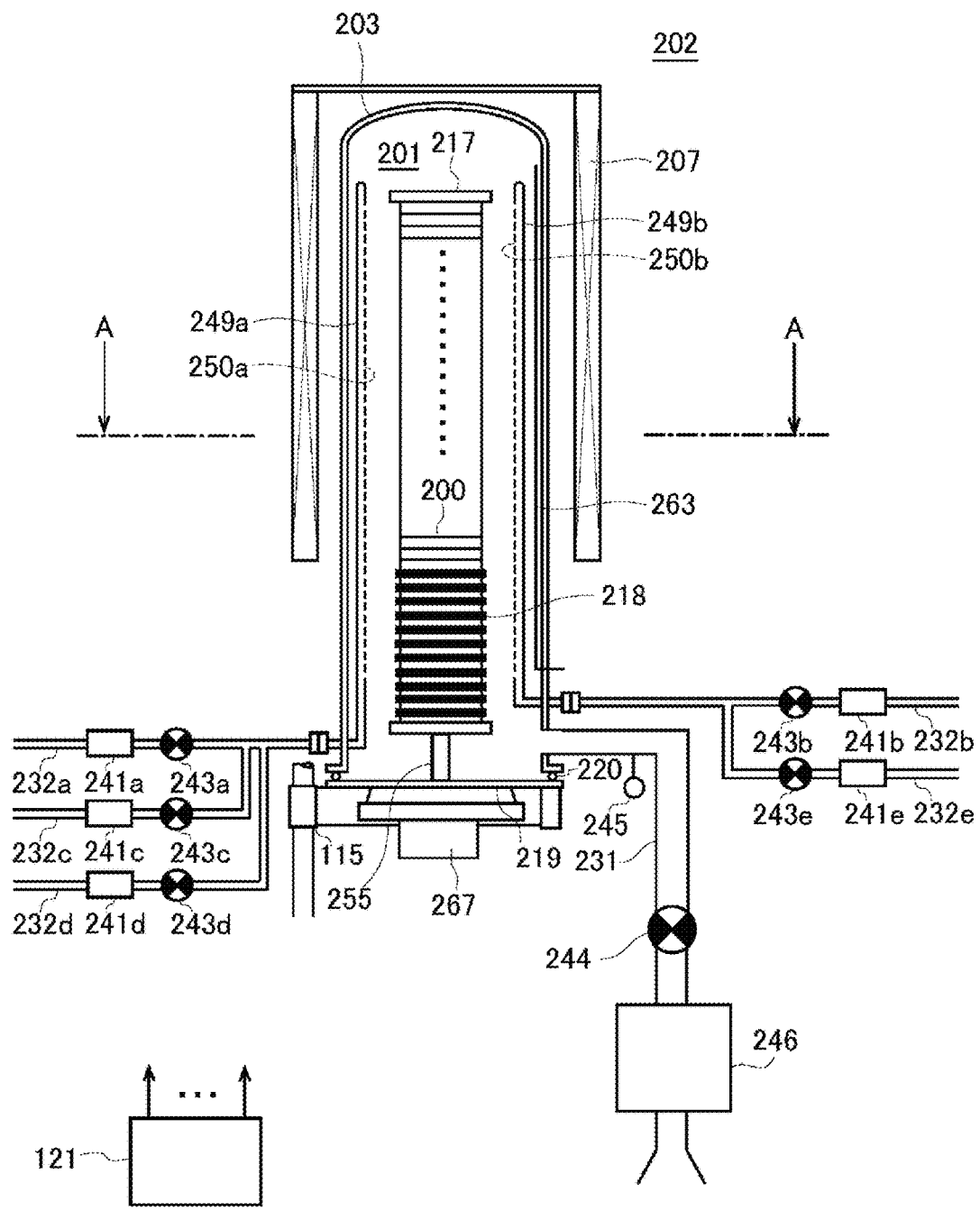
FIG. 8 is a schematic configuration view of a vertical processing furnace of a substrate processing apparatus suitably used in another embodiment of the present disclosure, in which a portion of the processing furnace is shown in a vertical cross section.

In the film forming sequence in which the $NH_3$ gas and the $O_2$ gas are supplied from different nozzles as described above, similar to the above-described embodiment, there may be a case where particles are likely to be generated in the nozzle 249b for supplying the $NH_3$ gas. On the other hand, by setting the supply conditions of the $N_2$ gas in the respective steps in the same manner as the supply conditions of the above-described embodiment, it is possible to obtain the same effects as those of the above-described embodiment. That is to say, in step 2 of supplying the $NH_3$ gas, the $N_2$ gas is supplied from the nozzle 249a at a first flow rate. In step 3 of supplying the $O_2$ gas, the $N_2$ gas is supplied from the nozzle 249b at a second flow rate larger than the first flow rate. This makes it possible to reliably avoid the generation of particles in the nozzle 249b and to improve the quality of the film forming process. The use of the substrate processing apparatus shown in FIG. 8 is preferred in that it is possible to simplify the structure thereof and to reduce the manufacturing cost or the maintenance cost of the apparatus. In addition, the use of the substrate processing apparatus shown in FIG. 1, which supplies these gases from different nozzles, is preferred in that it is possible to more reliably prevent a gas phase reaction between the HCDS gas and the $O_2$ gas in the nozzle 249a.

Moreover, for example, in the above-described embodiment, there has been described an example in which when forming the oxynitride film, the reactant gas (the oxidizing gas or the nitriding gas) is supplied after supplying the precursor gas. The present disclosure is not limited to such an embodiment. The supply order of the precursor gas and the reaction gas may be reversed. That is to say, after the reaction gas is supplied, the precursor gas may be supplied. By changing the supply order, it becomes possible to change the film quality or the composition ratio of a thin film to be formed. In addition, the order of supplying plural kinds of reaction gases may be arbitrarily changed. By changing the order of supplying the reaction gases, it becomes possible to change the film quality or the composition ratio of a thin film to be formed.

By using the silicon-based insulating film, which is formed by the film forming sequences shown in FIGS. 4 and 5 or the methods of the respective modifications, as a side wall spacer, it is possible to provide a device forming technique which is small in leakage current and excellent in workability. In addition, by using the aforementioned silicon-based insulating film as an etching stopper, it is possible to provide a device forming technique which is excellent in workability. Moreover, according to the film forming sequences shown in FIGS. 4 and 5 and the respective modifications, it is possible to form a silicon-based insulating film having an ideal stoichiometric ratio without having to use plasma. Since the silicon-based insulating film can be formed without having to use plasma, it is possible to apply the present disclosure to a process in which plasma damage of, for example, an SADP film of DPT is concerned.

The above-described film forming sequence may be suitably applied to a case where an oxynitride film containing a metal element such as titanium (Ti), zirconium (Zr), hafnium (Hf), tantalum (Ta), niobium (Nb), aluminum (Al), molybdenum (Mo), tungsten (W) or the like, i.e., a metal-based oxynitride film is formed on the wafer 200. For example, when a titanium tetrachloride ($TiCl_4$) gas is used as a precursor gas, a TiON film, a TiOCN film, a TiBOCN film and the like may be formed on the wafer by the following film forming sequences.

$(TiCl_4 \rightarrow NH_3 \rightarrow O_2) \times n \Rightarrow$ TiON film $(TiCl_4 \rightarrow C_3H_6 \rightarrow NH_3 \rightarrow O_2) \times n \Rightarrow$ TiOCN film $(TiCl_4 \rightarrow TEA \rightarrow NH_3 \rightarrow O_2) \times n \Rightarrow$ TiOCN film $(TiCl_4 \rightarrow TMB \rightarrow NH_3 \rightarrow O_2) \times n \Rightarrow$ TiBOCN film $(TiCl_4 \rightarrow C_3H_6 \rightarrow BCl_3 \rightarrow NH_3 \rightarrow O_2) \times n \Rightarrow$ TiBOCN film That is to say, the present disclosure may be suitably applied to, for example, a case of forming a metal-based oxynitride film such as a TiON film, a TiOCN film, a TiBOCN film, a ZrON film, a ZrOCN film, a ZrBOCN film, a HfON film, a HfOCN film, a HfBOCN film, a TaON film, a TaOCN film, a TaBOCN film, an NbON film, an NbOCN film, an NbBOCN film, an AlON film, an AlOCN film, an AlBOCN film, an MoON film, an MoOCN film, an MoBOCN film, a WON film, a WOCN film, a WBOCN film, or the like.

In these cases, as the precursor gas, it may be possible to use a precursor gas containing a metal element instead of the precursor gas containing a semiconductor element such as Si or the like used in the above-described embodiment. As the reaction gas, it may be possible to use the same gas as used in the above-described embodiment. The processing procedures and processing conditions at this time may be, for example, the same processing procedures and processing conditions as those of the above-described embodiment.

That is to say, the present disclosure may be suitably applied to a case of forming an oxynitride film containing a predetermined element such as a semiconductor element, a metal element or the like.

It is preferable that the process recipes (programs describing the processing procedures, the processing conditions and the like of the substrate processing process) used for forming these various thin films are individually prepared (prepared in a plural number) depending on the contents of the substrate processing process (film type, composition ratio, film quality, film thickness, processing procedures, processing conditions and the like of the thin film to be formed). Hereinafter, the process recipes are simply referred to as recipes. When starting the substrate processing process, it is preferable to appropriately select an appropriate recipe from a plurality of recipes according to the contents of the substrate processing process. Specifically, it is preferable that a plurality of recipes individually prepared according to the contents of the substrate processing process is stored (installed) in advance in the memory device 121c provided in the substrate processing apparatus through an electric communication line or a recording medium (external memory device 123) in which the recipes are recorded. When starting the substrate processing process, it is preferable that the CPU 121a of the substrate processing apparatus appropriately selects an appropriate recipe from the plurality of recipes stored in the memory device 121c according to the contents of the substrate processing process. With such a configuration, it is possible to form thin films of various film types, composition ratios, film qualities and film thicknesses by a single substrate processing apparatus in a versatile manner and with good reproducibility. In addition, it is possible to reduce the operator's operation burden (input burden of processing procedures and processing conditions, etc.) and to quickly start the substrate processing process while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus through a telecommunication line or a recording medium storing the recipes. In addition, the existing recipes already installed in the substrate processing apparatus may be directly modified by operating the input/output device 122 of the existing substrate processing apparatus.

In the above-described embodiment, there has been described an example in which thin films are formed using a batch-type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the above-described embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. Even in these cases, the processing procedures and the processing conditions may be similar to, for example, the processing procedures and the processing conditions of the above-described embodiment.

Figure 9:
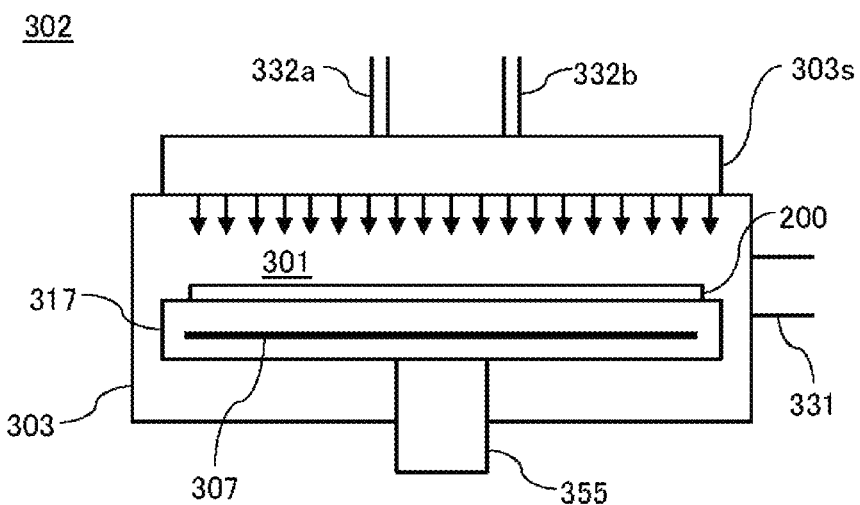
FIG. 9 is a schematic configuration view of a processing furnace of a substrate processing apparatus suitably used in a further embodiment of the present disclosure, in which a portion of the processing furnace is shown in a vertical cross section.

The present disclosure may be suitably applied to, for example, a case where a film is formed using a substrate processing apparatus provided with a processing furnace 302 illustrated in FIG. 9. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a for supplying the precursor gas, the O-containing gas or the like and a gas supply port 332b for supplying the N-containing gas are connected to inlets (gas introduction holes) of the shower head 303s. Gas supply systems similar to the precursor gas supply system, the O-containing gas supply system, the inert gas supply system and the like of the above-described embodiment are connected to the gas supply port 332a. Gas supply systems similar to the N-containing gas supply system, the inert gas supply system and the like of the above-described embodiment are connected to the gas supply port 332b. In the shower head 303s, for example, a first flow path communicating with the gas supply port 332a and allowing a precursor gas, an O-containing gas or the like to flow therethrough, and a second flow path communicating with the gas supply port 332b and allowing an N-containing gas or the like to flow therethrough are provided. The first flow path and the second flow path are provided separately (individually) in the shower head 303s without communicating with each other. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. An exhaust port 331 configured to evacuate the interior of the process chamber 301 is installed in the process vessel 303. An exhaust system similar to the exhaust system of the above-described embodiment is connected to the exhaust port 331.

Figure 10:
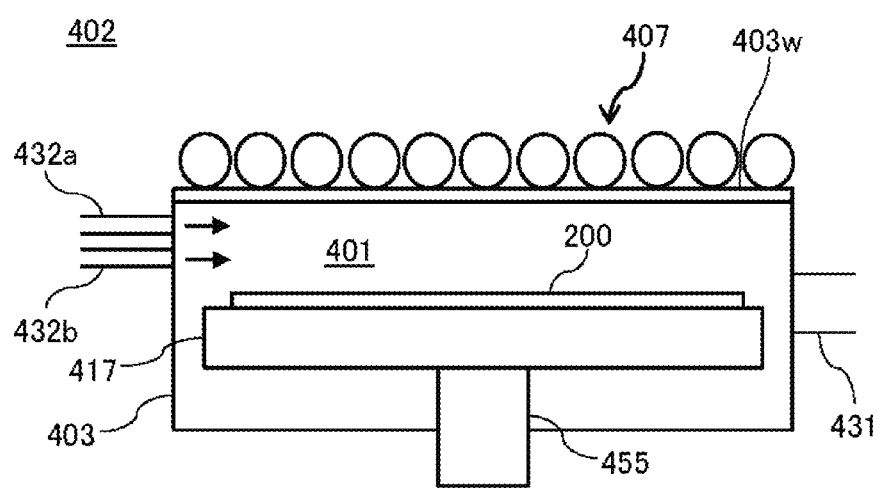
FIG. 10 is a schematic configuration view of a processing furnace of a substrate processing apparatus suitably used in a still further embodiment of the present disclosure, in which a portion of the processing furnace is shown in a vertical cross section.

In addition, the present disclosure may be suitably applied to, for example, a case where a film is formed using a substrate processing apparatus provided with a processing furnace 402 illustrated in FIG. 10. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. A gas supply port 432a for supplying the precursor gas, the O-containing gas or the like and a gas supply port 432b as a gas supply part for supplying the N-containing gas or the like are connected to the process vessel 403. Gas supply systems similar to the precursor gas supply system, the O-containing gas supply system, the inert gas supply system and the like of the above-described embodiment are connected to the gas supply port 432a. Gas supply systems similar to the N-containing gas supply system, the inert gas supply system and the like of the above-described embodiment are connected to the gas supply port 432b. The gas supply ports 432a and 432b are respectively installed at the lateral side of the end portions of the wafers 200 carried into the process chamber 401, namely in such positions as not to face the surfaces of the wafers 200 carried into the process chamber 401. An exhaust port 431 configured to evacuate the interior of the process chamber 401 is installed in the process vessel 403. An exhaust system similar to the exhaust system of the above-described embodiment is connected to the exhaust port 431.

In the case of using these substrate processing apparatuses, a film forming process may be performed by the sequences and processing conditions similar to those of the embodiment and modifications described above.

Further, the embodiments and modifications described above may be appropriately combined with one another. In addition, the processing conditions used at this time may be similar to, for example, the processing conditions of the embodiments described above.

EXAMPLES

Hereinafter, experimental results that support the effects obtained in the above-described embodiments and modifications will be described.

Example 1

Using the substrate processing apparatus shown in FIG. 8, SiON films were formed on a plurality of wafers by a film forming sequence shown in FIG. 5. An HCDS gas was used as a precursor gas, an $NH_3$ gas was used as a nitriding gas, an $O_2$ gas was used as an oxidizing gas, and an $N_2$ gas was used as the inert gas. The HCDS gas and the $O_2$ gas were supplied through a first nozzle and the $NH_3$ gas was supplied through a second nozzle. The supply flow rate of the HCDS gas was set to a flow rate in a range of 0.2 to 0.5 slm, the supply flow rate of the $NH_3$ gas was set to a flow rate in a range of 4 to 6 slm, the supply flow rate of the $O_2$ gas was set to a flow rate in a range of 2 to 3 slm. In the step of supplying the $NH_3$ gas, the $N_2$ gas was supplied from the first nozzle at a flow rate (first flow rate) in a range of 0.3 to 0.5 slm. In the step of supplying the $O_2$ gas, the $N_2$ gas was supplied from the second nozzle at a flow rate (second flow rate) in a range of 1.5 to 2 slm. That is to say, the second flow rate was set to a flow rate in a range of 3 to 6 times of the first flow rate. The temperature of the wafers was set to a temperature in a range of 650 to 700 degrees C., and the number of times of execution of the cycle was set in a range of 50 to 100 times. Other processing conditions were set to be in the range of the processing conditions described in the above embodiment. The number of particles adhering to the wafer surface was measured at both timings before and after film formation.

Figure 6A:
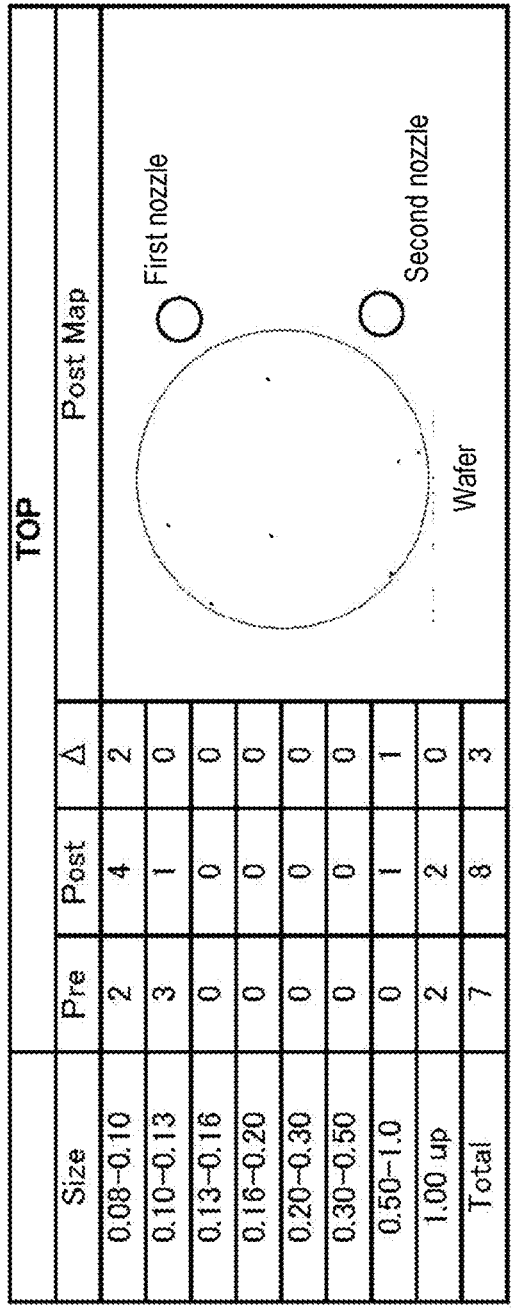
FIG. 6A is a view showing the measurement result of the number of particles in a wafer disposed in a TOP region.
Figure 6B:
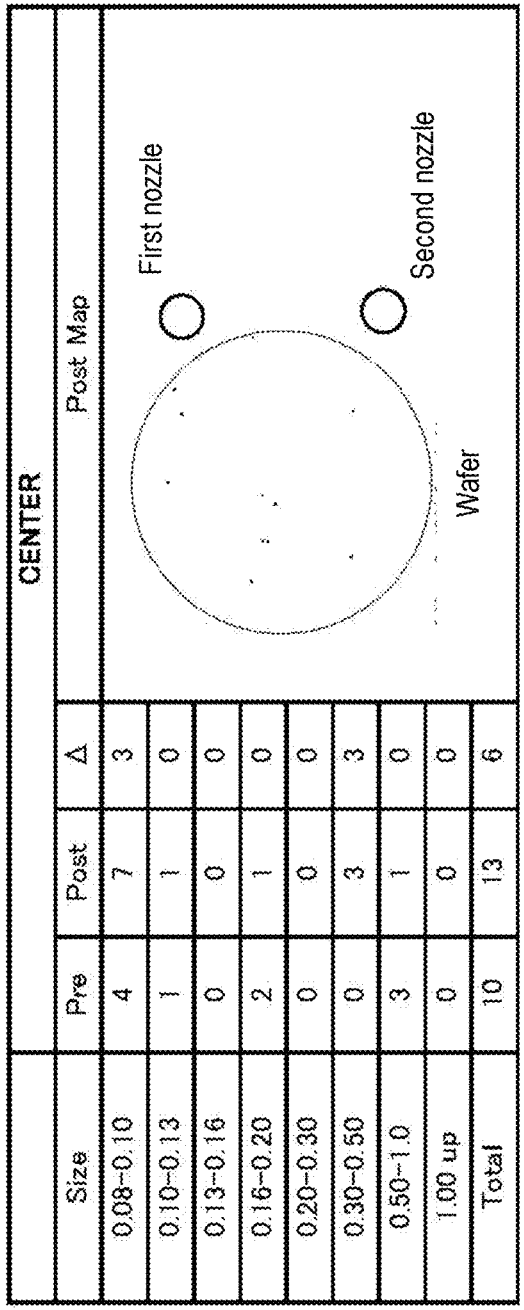
FIG. 6B is a view showing the measurement result of the number of particles in a wafer disposed in a CENTER region.
Figure 6C:
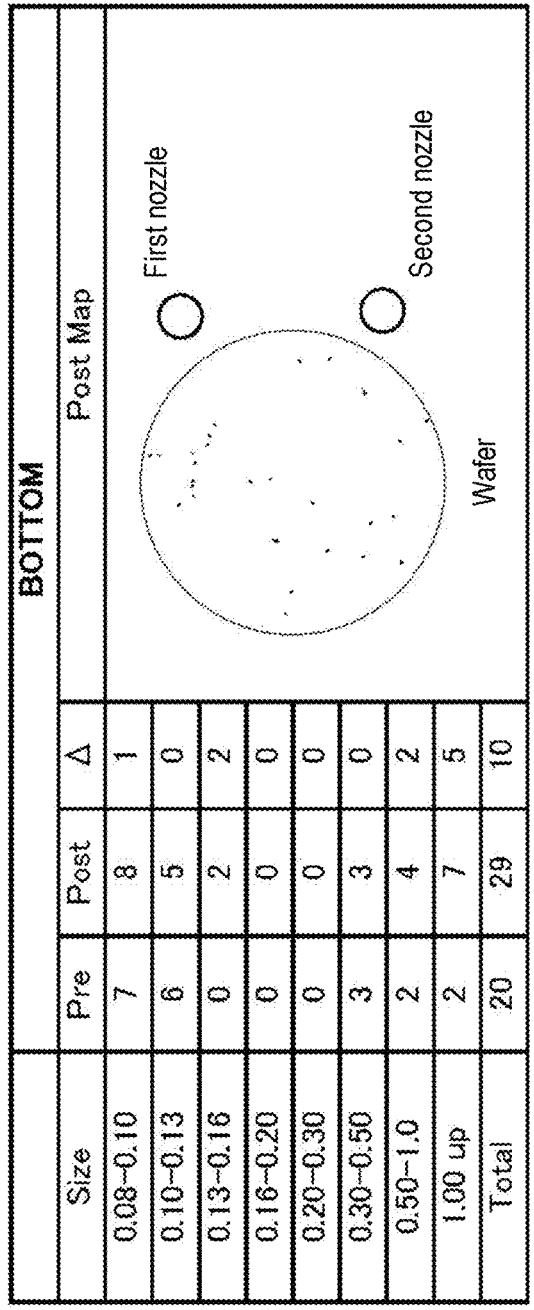
FIG. 6C is a view showing the measurement result of the number of particles in a wafer disposed in a BOTTOM region.

FIGS. 6A to 6C are views showing the measurement results of the number of particles on the wafer surface, respectively. "TOP", "CENTER" and "BOTTOM" in these drawings indicate the positions of the wafers in a boat (the upper part, the center part, and the lower part of the boat in order), respectively. Further, "Size" indicates the outer diameter of the particles. Moreover, "Pre" refers to the number of particles observed on the wafer surface before film formation, "Post" refers to the number of particles observed on the wafer surface after film formation, "Δ" refers to a difference between them, "Total" refers to the total number of particles in "Pre", "Post", and "Δ". In addition, the diagram shown in "Post Map" indicates the state of the wafer surface after film formation.

According to these diagrams, it is understood that the number of particles observed on the wafer surface after the film forming process is extremely small. Presumably, this is because, in the step of supplying the $NH_3$ gas, the $N_2$ gas is supplied from the first nozzle at the first flow rate, and in the step of supplying the $O_2$ gas, the $N_2$ gas is supplied from the second nozzle at the second flow rate larger than the first flow rate, which makes it possible to reliably prevent generation of particles in the second nozzle. As described above, according to another evaluation (in a comparative example) conducted by the inventors, it was confirmed that, if the flow rate of the $N_2$ gas supplied from the second nozzle in the step of supplying the $O_2$ gas is set to be smaller than the flow rate of the $N_2$ gas supplied from the first nozzle in the step of supplying the $NH_3$ gas, a large amount of particles may be generated in the second nozzle in some cases. Incidentally, the inventors have confirmed that the in-plane film thickness uniformity of the SiON film formed in the example was 0.83%, which is equivalent to the in-plane film thickness uniformity of the SiON film formed in the comparative example. That is to say, the inventors have confirmed that, even if the flow rate of the $N_2$ gas supplied from the second nozzle is set as described above, it is possible to maintain the in-plane film thickness uniformity of the SiON film. In this regard, the in-plane film thickness uniformity (±%) is a value defined by {(maximum film thickness in wafer plane−minimum film thickness in wafer plane)/(2×average film thickness in wafer plane)}×100. The smaller the value, the more uniform the film thickness in the wafer plane.

Example 2

Using the substrate processing apparatus shown in FIG. 8, a film forming process for forming SiON films on a plurality of wafers by the film forming sequence shown in FIG. 5 was performed a plurality of times. Each time when the film forming process is performed, the supply flow rate of the $N_2$ gas (hereinafter also referred to as a counter $N_2$ gas) supplied from the second nozzle in the step of supplying the $O_2$ gas was changed to 0.5 slm, 1 slm, 2 slm, and 5 slm. In either case, the wafers were not rotated during the film forming process. Other processing conditions were the same as in example 1. The number of particles adhering to the wafer surface was measured at both timings before and after film formation.

Figure 7B:
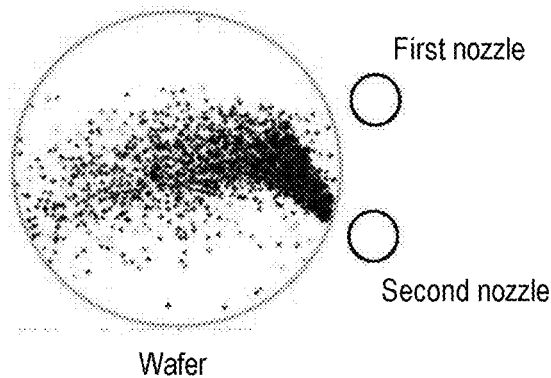
FIG. 7B is a view showing the state of a wafer surface after film formation in the case where the flow rate of an $N_2$ gas supplied from a second nozzle at a step of supplying an $O_2$ gas is set to 0.5 slm.
Figure 7C:
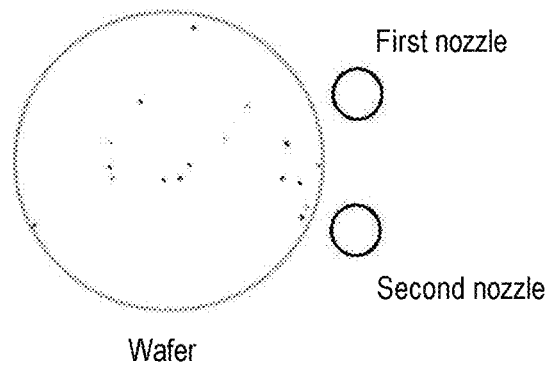
FIG. 7C is a view showing the state of a wafer surface after film formation in the case where the flow rate of an $N_2$ gas supplied from a second nozzle at a step of supplying an $O_2$ gas is set to 5 slm.
Figure 7D:
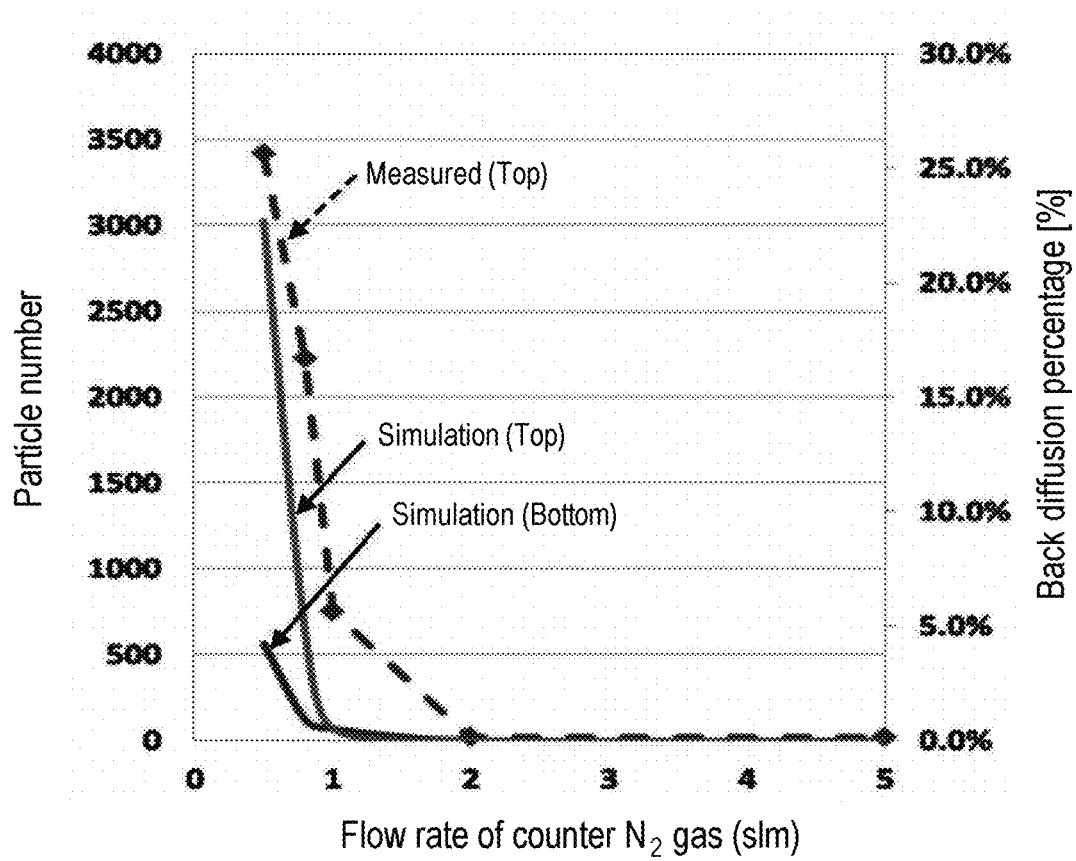
FIG. 7D is a view showing the measurement result of the number of particles on a wafer surface in comparison with the simulation result.

FIG. 7A is a view showing the measurement results of the number of particles on the wafer surface. The vertical axis in FIG. 7A indicates the difference between the number of particles observed on the wafer surface before film formation and the number of particles observed on the wafer surface after film formation. The horizontal axis in FIG. 7A indicates the flow rate (slm) of the counter $N_2$ gas. FIG. 7B is a view showing the state of the wafer surface after film formation when the flow rate of the counter $N_2$ gas is 0.5 slm. FIG. 7C is a view showing the state of the wafer surface after film formation when the flow rate of the counter $N_2$ gas is 5 slm. FIG. 7D is a view showing the measurement result (dotted line) of the number of particles on the wafer surface and the simulation result (solid line) in comparison with each other.

As shown in these drawings, it can be understood that, when the supply flow rate of the counter $N_2$ gas is set to 0.5 slm, a large amount of particles adhere to the wafer surface, and the difference in the number of particles before and after film formation is 3400 or more. From the in-plane distribution of particles, it can also be understood that the particles observed at this time are generated in the second nozzle. It can be seen that, when the supply flow rate of the counter $N_2$ gas is set to 1 slm, the amount of particles adsorbed on the wafer surface can be reduced to about ¼ as compared with a case where the supply flow rate of the counter $N_2$ gas is set to 0.5 slm. It can be noted that, when the supply flow rate of the counter $N_2$ gas is 2 slm or more, the amount of particles adsorbed on the wafer surface can be greatly reduced, and further that, when the supply flow rate of the counter $N_2$ gas is 5 slm or more, the difference in the number of particles before and after film formation is about several particles in number. It can be noted that these observation results are in good agreement with the simulation results indicated by a solid line in FIG. 7D. The inventors have confirmed that the SiON film obtained when the flow rate of the counter $N_2$ gas is 5 slm has the same in-plane film thickness uniformity as the SiON film obtained when the supply flow rate of the counter $N_2$ gas is 0.5 slm. That is to say, the inventors have confirmed that the in-plane film thickness uniformity of the SiON film can be maintained even if the flow rate of the counter $N_2$ gas is increased.

<Aspects of Present Disclosure>

Hereinafter, some aspects of the present disclosure will be additionally described as supplementary notes.

(Supplementary Note 1)

According to another aspect of the present disclosure, there is provided a method of manufacturing a semiconductor device or a substrate processing method, comprising:

forming an oxynitride film on a substrate by performing a cycle a predetermined number of times, the cycle including non-simultaneously performing supplying a precursor gas to the substrate through a first nozzle, supplying a nitriding gas to the substrate through a second nozzle, and supplying an oxidizing gas to the substrate through the first nozzle, wherein in the act of supplying the nitriding gas, an inert gas is supplied from the first nozzle at a first flow rate, and in the act of supplying the oxidizing gas, an inert gas is supplied from the second nozzle at a second flow rate larger than the first flow rate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming an oxynitride film on a substrate by performing a cycle a predetermined number of times, the cycle including non-simultaneously performing:
      concurrently supplying to the substrate a precursor gas through a first nozzle and a first inert gas at a first flow rate through at least one of a second nozzle and a third nozzle,
      concurrently supplying to the substrate a nitriding gas through the second nozzle and a second inert gas at a second flow rate through at least one of the first nozzle and the third nozzle, wherein the second nozzle and the third nozzle are separate from each other, and
      concurrently supplying to the substrate an oxidizing gas through the third nozzle and a third inert gas through, the second nozzle at a third flow rate, wherein the first flow rate is smaller than the third flow rate and the third flow rate is larger than the second flow rate such that the oxidizing gas supplied from the third nozzle is prevented from being mixed with the nitriding gas remaining in the second nozzle;
   wherein the first flow rate is selected from a first range of 100 to 1000 sccm.

2. The method of claim 1, wherein during a period after the supplying the oxidizing gas and before the supplying the precursor gas again, the third inert gas is supplied from the second nozzle at the third flow rate.

3. The method of claim 2, wherein during a period after the supplying the nitriding gas and before the supplying the oxidizing gas, the third inert gas is supplied from the second nozzle at the third flow rate.

4. The method of claim 1, wherein during a period after the supplying the oxidizing gas and before the supplying the precursor gas again, vacuum drawing of a space where the substrate exists in a state in which supply of a gas is stopped is not performed.

5. The method of claim 4, wherein during a period after the supplying the nitriding gas and before the supplying the oxidizing gas, vacuum drawing of a space where the substrate exists in a state in which supply of a gas is stopped is not performed.

6. The method of claim 5, wherein during a period after the supplying the precursor gas and before the supplying the nitriding gas, vacuum drawing of a space where the substrate exists in a state in which supply of a gas is stopped is performed.

7. The method of claim 1, wherein the first nozzle and the third nozzle are nozzles different from the second nozzle.

8. The method of claim 1, wherein the first nozzle is a different nozzle from the second nozzle and is a same nozzle as the third nozzle.

9. The method of claim 1, wherein the first flow rate is a flow rate equal to or smaller than the second flow rate.

10. A non-transitory computer-readable recording medium storing a program that causes a computer to perform:
    forming an oxynitride film on a substrate by performing a cycle a predetermined number of times, the cycle including non-simultaneously performing:
       concurrently supplying to the substrate a precursor gas through a first nozzle and a first inert gas at a first flow rate through at least one of a second nozzle and a third nozzle,
       concurrently supplying to the substrate a nitriding gas through the second nozzle and a second inert gas at a second flow rate through at least one of the first nozzle and the third nozzle, wherein the second nozzle and the third nozzle are separate from each other, and
       concurrently supplying to the substrate an oxidizing gas through the third nozzle and a third inert gas through, the second nozzle at a third flow rate, wherein the first flow rate is smaller than the third flow rate and the third flow rate is larger than the first flow rate such that the oxidizing gas supplied from the third nozzle is prevented from being mixed with the nitriding gas remaining in the second nozzle;
    wherein the first flow rate is selected from a first range of 100 to 1000 sccm.

11. The method of claim 1, wherein:
    the second flow rate is selected from a second range of 500 to 1,500 sccm, and
    the third flow rate is selected from a third range of 2,000 to 10,000 sccm.

12. The method of claim 1, wherein in the supplying the oxidizing gas, the third inert gas is supplied into the second nozzle at the third flow rate such that the oxidizing gas supplied from the third nozzle is prevented from generating a radical by a reaction between the oxidizing gas and the nitriding gas.

13. The method of claim 12, wherein impurities including a metal element is contained in an inner wall surface of the second nozzle, and
    wherein in the supplying the oxidizing gas, the third inert gas is supplied into the second nozzle at the third flow rate such that the impurities are prevented from reacting with the radical by preventing the radical from being generated in the second nozzle.

14. The non-transitory computer-readable recording medium of claim 10, wherein:
    the second flow rate is selected from a second range of 500 to 1,500 sccm, and
    the third flow rate is selected from a third range of 2,000 to 10,000 sccm.

* * * * *